(12) United States Patent
Koyama et al.

(10) Patent No.: US 7,791,576 B2
(45) Date of Patent: *Sep. 7, 2010

(54) SIGNAL DIVIDING CIRCUIT AND SEMICONDUCTOR DEVICE

(75) Inventors: Jun Koyama, Kanagawa (JP); Mitsuaki Osame, Kanagawa (JP); Yasushi Ogata, Kanagawa (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 1230 days.

This patent is subject to a terminal disclaimer.

(21) Appl. No.: 11/291,875

(22) Filed: Dec. 2, 2005

(65) Prior Publication Data

US 2006/0156082 A1    Jul. 13, 2006

Related U.S. Application Data

(62) Division of application No. 09/206,297, filed on Dec. 7, 1998, now Pat. No. 6,992,651.

(30) Foreign Application Priority Data

Dec. 8, 1997   (JP) .................................. 09-356238
May 16, 1998  (JP) .................................. 10-152307

(51) Int. Cl.
    *G09G 3/36*   (2006.01)
(52) U.S. Cl. ............................. 345/92; 345/87; 345/89
(58) Field of Classification Search .................. 345/92, 345/87, 55, 89; 257/359, 59, 72
    See application file for complete search history.

(56) References Cited

U.S. PATENT DOCUMENTS

| | | |
|---|---|---|
| 4,644,338 A | 2/1987 | Aoki et al. |
| 4,736,137 A | 4/1988 | Ohwada et al. |
| 4,782,340 A | 11/1988 | Czubatyj et al. |
| 4,872,002 A | 10/1989 | Stewart et al. |
| 4,908,517 A | 3/1990 | Imamura |

(Continued)

FOREIGN PATENT DOCUMENTS

EP    0 354 372    2/1990

(Continued)

OTHER PUBLICATIONS

European Search Report dated Oct. 18, 1999 for Application No. 98123366.1.

(Continued)

*Primary Examiner*—Fritz Alphonse
(74) *Attorney, Agent, or Firm*—Eric J. Robinson; Robinson Intellectual Property Law Office, P.C.

(57) ABSTRACT

To provide a constitution capable of reducing production cost in a semiconductor device for display of a type integrally formed with a drive circuit with a digital signal as an input signal and a pixel matrix unit, a signal dividing circuit is formed on a substrate where drive circuits and a pixel matrix unit are to be formed simultaneously with the drive circuits and the pixel matrix unit in view of fabrication steps by which fabrication steps of the signal dividing circuit per se and steps required for connecting the signal dividing circuit to wirings on the substrate can be dispensed with without adding further steps.

12 Claims, 17 Drawing Sheets

U.S. PATENT DOCUMENTS

| | | | |
|---|---|---|---|
| 5,250,937 | A | 10/1993 | Kikuo et al. |
| 5,525,867 | A | 6/1996 | Williams |
| 5,543,352 | A | 8/1996 | Ohtani et al. |
| 5,563,426 | A | 10/1996 | Zhang et al. |
| 5,604,360 | A | 2/1997 | Zhang et al. |
| 5,643,826 | A | 7/1997 | Ohtani et al. |
| 5,648,277 | A | 7/1997 | Zhang et al. |
| 5,712,653 | A | 1/1998 | Katoh et al. |
| 5,851,440 | A | 12/1998 | Tanaka et al. |
| 5,877,740 | A | 3/1999 | Hirakata et al. |
| 5,923,962 | A | 7/1999 | Ohtani et al. |
| 6,140,667 | A | 10/2000 | Yamazaki et al. |
| 6,147,667 | A | 11/2000 | Yamazaki et al. |
| 6,369,788 | B1 | 4/2002 | Yamazaki et al. |
| 6,549,184 | B1 | 4/2003 | Koyama et al. |
| 6,893,906 | B2 | 5/2005 | Yamazaki et al. |
| 2001/0050664 | A1 | 12/2001 | Yamazaki et al. |
| 2005/0237442 | A1 | 10/2005 | Yamazaki et al. |

FOREIGN PATENT DOCUMENTS

| | | |
|---|---|---|
| EP | 0 486 284 | 5/1992 |
| EP | 0 718 816 | 6/1996 |
| EP | 0 789 345 | 8/1997 |
| JP | 04-177326 | 6/1992 |
| JP | 06-161393 | 6/1994 |
| JP | 07-321339 | 12/1995 |
| JP | 08-078329 | 3/1996 |
| JP | 08-274338 | 10/1996 |
| JP | 09-274470 | 10/1997 |

OTHER PUBLICATIONS

T. Sameshima, *Laser Processing for Thin Film Transistor Applications*, Materials Science and Engineering, vol. B45, Mar. 1, 1997, pp. 186-193.

K.T-Y. Kung et al., *Polycrystalline Si Thin-Film Transistors Fabricated at ≤ 800° C.: Effects of Grain Size and {110} Fiber Texture*, J. Appl. Phys., vol. 62, No. 4, Aug. 15, 1987, pp. 1503-1509.

EPO Communication dated May 23, 2006 for Application No. 98 123 366.1.

European Search Report dated Oct. 18, 1999.

Ohtani et al., "LP-B: Late-news Poster: A 60-in. HDTV Rear-Projector with Continuous-Grain Silicon Technology," May 17-22, 1998, pp. 467-470, SID 98 Digest, International Symposium Digest of Technical Papers, vol. XXIX.

CK, CKb ; CLOCK SIGNALS SC, SCb ; MODIFIED CLOCK SIGNALS
RS ; RESET SIGNAL DS ; INPUT DIGITAL SIGNAL
OL1, OL2, OL3, OL4 ; OUTPUTS OF RESPECTIVE LATCH PRESTAGES
SD1, SD2, SD3, SD4 ; MODIFIED DIGITAL SIGNALS

INVERTER | PIXEL TFT

DS1, DS2 ; INPUT DIGITAL SIGNALS
SD1, SD2, SD3, SD4 ; MODIFIED DIGITAL SIGNALS

5nm

5nm 0.1μm 0.1μm

2μm

2μm

SIGNAL DIVIDING CIRCUIT AND SEMICONDUCTOR DEVICE

CROSS REFERENCE TO RELATED APPLICATIONS

This application is a divisional of U.S. application Ser. No. 09/206,297 filed Dec. 7, 1998, now U.S. Pat. No. 6,992,651 and claims priority of JP application 09-356238 filed Dec. 8, 1997 and JP 10-152307 filed May 16, 1998.

BACKGROUND OF THE INVENTION

1. Field of the Invention

The present invention disclosed in the specification relates to a semiconductor device with a digital signal as an input signal. For example, the present invention can be utilized in a liquid crystal display device of an active matrix type, an EL (electroluminescence) display device and so on. More accurately, the present invention can be utilized in a drive substrate of a liquid crystal display device of an active matrix type, an EL display device and the like.

2. Description of Related Art

There is provided a liquid crystal display device of an active matrix type as an example of a semiconductor device with a digital signal as an input signal.

Conventionally, a liquid crystal display device of an active matrix type with a digital signal as an input signal is provided with a constitution as shown by FIG. 1.

A signal dividing circuit 102 receives an input of a digital signal for constituting an input signal (hereinafter, input digital signal) and outputs a modified digital signal of which a pulse length is expanded over time (although the length may be expanded by any magnification, it is most general to expand it by a magnification of m) to a modified digital signal line 112. The expansion over time of the pulse length of the input digital signal by a magnification of m signifies, in other words, a reduction in the frequency of the input digital signal by a magnification of 1/m.

Although respective single ones of input digital signal line 111 and the modified digital signal line 112 are illustrated in FIG. 1, actually, there are n of the input digital signal lines and m×n of the modified digital signal lines. "n" designates a natural number and "m" designates a natural number of 2 or higher. Further, m of the modified digital signals in correspondence with m of the consecutive input digital signals in the respective input digital signal lines, are outputted to m of the modified digital signal lines separated from each other. That is, in respect of an arbitrary one of m×n of the modified digital signal lines, two of the consecutive modified digital signals correspond to two of the input digital signals which are disposed at the interval of m thereof in a certain input digital signal line. Numeral 101 shows a digital signal source.

FIG. 9 shows an example of timing charts in the case of n=2 and m=2. In reference to FIG. 9, modified digital signals of SD1 or the like are outputted at one of four modified digital signal lines and two consecutive modified digital signals P and Q respectively correspond to A and C of signals DS1 transmitted by one of input digital signal lines. Similarly, W and X in signals SD2 outputted to other modified digital signal line respectively correspond to D and F of the signals DS1. Further, s and u of signals SD3 outputted to other modified digital signal line respectively correspond to g and i of signals DS2 transmitted by other input digital signal line.

A signal line drive circuit 104 and a scanning line drive circuit 105 shown in the FIG. 1 receive modified digital signals from the modified digital signal line 112, convert them into gradation voltage signals at predetermined timings and write them to predetermined pixels.

A pixel matrix unit 106 is arranged with the respective pixels to which the gradation voltage signals are written in a shape of a lattice or in a shape of substantially a lattice (for example, delta arrangement or the like). Further, the pixel matrix portion displays a picture image of one screen by a total or a portion thereof. Numeral 103 shows a substrate having an insulating surface; for example, a glass.

Conventionally, the signal dividing circuit is provided with the following considerable significance. That is, the input digital signal is normally of several 10 MHz (in future, input digital signals of one hundred and several tens MHz may become general). However, under such a high frequency condition, function of a transistor in the drive circuit is insufficient, the operation of the circuit is not feasible or devoid of reliability. Hence, it is indispensable to reduce the frequency of the input digital signal to a degree whereby the drive circuit can be operated sufficiently and the signal dividing circuit plays a role of reducing the frequency of the input digital signal.

However, even when the function of the transistor in the drive circuit is promoted, the signal dividing circuit is not immediately dispensed with. The function of the transistor is not the only factor for enabling the operation of the drive circuit under the high frequency condition.

Firstly, there is a problem caused by resistance or capacitance. In a real liquid crystal display device, the scale of the drive circuit is large and accordingly, lines for transmitting signals necessary for operating the drive circuit from outside and power source lines are prolonged, resulting in a resistance. Further, a number of elements are connected to the respective lines and therefore, large load capacitance is added. Then, when the frequency of a signal transmitted from outside is high, there may cause a hazard in normally operating the drive circuit such that the signal becomes considerably blunted in the drive circuit, when a voltage value of the power source line is instantaneously changed by influence of certain operation in the drive circuit, a time period permitted for the recovery becomes deficient and so on.

For example, a shift register is used in the drive circuit and in inputting a clock signal of the shift register, the clock line is long and a number of clocked inverters are connected. Therefore, the shift register may not be operated normally when the bluntness of the clock signal exceeds a limit at a midway and the clock signal cannot be read at a predetermined timing.

By contrast, an area of the signal dividing circuit is normally much smaller than an area of the drive circuit and therefore, power lines or respective signal supply lines are short, connected load capacitance is also small and accordingly, even when a frequency of a signal from outside necessary for operation is high, there is no hazard in normal operation as in the drive circuit.

Hence, by reducing the frequency of the input digital signal by a magnification of 1/m by using the signal dividing circuit, the frequency of a signal necessary for operating the drive circuit can be reduced by the magnification of 1/m and occurrence of inconvenience as mentioned above which is caused in the drive circuit when the input digital signal or other signal transmitted from outside is at high frequencies. In this case, although to what degree the frequency of the input digital signal is to be reduced, needs to determine specifically in respect of individual drive circuits, it is normally sufficient to reduce it to 20 MHz or lower.

Secondary, there poses a problem of matching of timings of signals. Even in the case of transistors capable of operating under high frequency conditions, a dispersion to some degree is obliged to cause in response speeds of the individual transistors. The drive circuit is constituted by integrating a number of transistors and therefore, a shift in respect of a predetermined timing is produced which is caused by integration of the dispersion, however, the magnitude of the shift is not dependent on high or low of the frequency. Accordingly, the higher the frequency, the larger the relative influence of the shift and the higher the probability by which a total of the drive circuit does not perform normal operation is increased.

To what degree the frequency of the input digital signal is to be reduced to avoid the danger, is actually determined specifically and empirically in respect of individual drive circuits. However, the dispersion in the response speeds of the individual transistors needs to be roughly equal to or lower than 20 MHz in consideration of current fabrication steps of transistors.

Next, a description will be given of transistors used in circuits of the signal dividing circuit, the drive circuit and the pixel matrix unit.

It is not indispensable to use transistors in the circuit of the pixel matrix unit, different from the signal dividing circuit and the drive circuit. However, a screen having excellent quality in which interference of voltage information among pixels is restrained is realized by controlling voltage information written to respective pixels by using transistors, that is, by adopting an active matrix system. The transistor is required to be present on a substrate for transmitting visible light in a very small scale (much smaller than size of pixel, representatively, about 20 micrometers square) and therefore, a thin film transistor (abbreviated as TFT) is used.

Currently, there are a case in which TFTs are used in the drive circuit and a case in which ICs (Integrated Circuit) of MOSFETs (Metal Oxide Silicon Field Effect Transistor). When TFTs are used, the drive matrix unit and the drive circuit can be formed simultaneously on a substrate (which is referred to as integral formation) which contributes to reduction in production steps or expense by that amount. When ICs are used, they are used by mounting them externally on a substrate, although wirings for connecting ICs and the pixel matrix unit are needed, the function of TFT in the pixel matrix unit may be low which is an advantage. When ICs are used, there is a chip on glass (COG) system in which ICs are pasted on a substrate where the pixel matrix unit is formed.

In the signal dividing circuit, TFTs have not been used and only externally mounted ICs have been used. The reason is that the quality of a silicon film used in channels of TFTs has not been sufficient. As mentioned above, the input digital signal is normally of several tens MHz, however, under such a situation, the field effect mobility of carriers of TFT has been about 50 cm²/Vs even with a polycrystal silicon (polysilicon) film which has best quality among silicon films which have been used in channels of TFTs and therefore, in reality, TFTs cannot be driven under a high frequency condition of 10 MHz or higher.

However, when the pixel matrix unit and the drive circuit are integrally formed by TFTs, according to the method in which externally mounted ICs are used in the signal dividing circuit, extra steps and expense are needed for the externally mounting operation and an increase in production cost is unavoidable by that amount. Therefore, advantage of integral formation of a reduction in production cost has not sufficiently been achieved.

Further, the field effect mobility of TFT used in the specification is calculated from the following equation or an equation equivalent thereto.

$$\mu_{FE} = (L d_{OX}/W S \in V_D) \times (dI_D/dV_G)$$

where L designates a channel length of TFT, W designates a channel width, S designates a channel area, $d_{OX}$ designates a gate insulating film thickness, $\in$ designates the dielectric constant of a gate insulating film, $dV_G$ designates a change in gate voltage, $dI_D$ designates a change in drain current and $V_D$ designates drain voltage (which is set to 1 V). As is apparent from the equation, although the field effect mobility $\mu_{FE}$ is changed by being dependent on $V_G$, the mobility of TFT indicates a maximum value of the mobility $\mu_{FE}$ (refer to FIG. 8A).

According to a semiconductor device with a digital signal as an input signal, for example, a liquid crystal display device of an active matrix type, an EL display device or the like, a method of integrally forming the device by using TFTs in a pixel matrix unit and a drive circuit is very valuable in view of reduction in production steps and expense. It is requested to sufficiently achieve the advantage.

SUMMARY OF THE INVENTION

It is a problem of the present invention disclosed in the specification to provide a constitution in a semiconductor device with a digital signal as an input signal which is capable of restraining low production steps and expense while maintaining function of signal processing thereof.

According to an aspect of the present invention disclosed in the specification, there is provided a signal dividing circuit having n of input units and m×n of output units in which n of the input units are respectively supplied with input digital signals and any of m×n of the output units transmits modified digital signals produced by extending over time a length of a pulse of the input digital signals and which is fabricated by using TFTs on a substrate having an insulating surface:

wherein n designates a natural number and m designates a natural number of 2 or more; and wherein said TFTs are constituted by at least one p-channel type TFT and at least one n-channel type TFT, and wherein a field effect mobility of carriers of said p-channel type TFT and said n-channel type TFT is equal to or more than 150 cm²/Vs. The carriers of said n-channel type TFT and of said p-channel type TFT are electrons and holes respectively.

In this case, it is preferable that an S value (sub threshold coefficient) of TFTs is equal to or lower than 0.15 V/dec and threshold voltage is −1.0 V through 0.0 V in the case of P-channel TFT and 0.0 V through 1.0 V in the case of N-channel TFT.

The modified digital signal may be produced by extending over time the length of the pulse of the input digital signal by any magnification. The magnification is not limited to a magnification of a natural number. However, it is most convenient to set it to a magnification of m and its value of utilization is also high.

According to other aspect of the present invention, there is provided a semiconductor device having a signal dividing circuit:

wherein the signal dividing circuit comprises n of input units and m×n of output units, n of the input units are supplied with input digital signals and any of m×n of the output units transmits modified digital signals produced by extending a length of a pulse of the input digital signals, the signal dividing circuit being fabricated by using TFTs on a substrate having an insulating surface;

wherein n designates a natural number and m designates a natural number of 2 or more; and wherein said TFTs are constituted by at least one p-channel type TFT and at least one n-channel type TFT, and wherein a field effect mobility of carriers of said p-channel type TFT and said n-channel type TFT is equal to or more than 150 cm²/Vs. The carriers of said n-channel type TFT and of said p-channel type TFT are electrons and holes respectively.

In this case, it is preferable to form the signal dividing circuit integrally with a circuit of a pixel matrix unit and a drive circuit. It is referred to as integral formation to form them on the same insulator substrate simultaneously in view of fabrication steps.

The present invention can be utilized in, for example, a liquid crystal display device or an EL display device or the like.

The mobility of TFT used in the specification is calculated from the following equation or an equation equivalent thereto.

$$\mu_{FE}=(Ld_{OX}/WS\in V_D)\times(dI_D/dV_G)$$

where L designates a channel length of TFT, W designates a channel width, S designates a channel area, $d_{OX}$ designates a gate insulating film thickness, $\in$ designates the dielectric constant of a gate insulating film, $dV_G$ designates a change in gate voltage, $dI_D$ designates a change in drain current and $V_D$ designates drain voltage (which is set to 1 V). As is apparent from the equation, although the mobility μ is changed by being dependent on $V_G$, the mobility of TFT indicates a maximum value of the mobility $\mu_{FE}$ (refer to FIG. 8A).

Further, the threshold voltage of TFT is determined to be equal to the gate voltage $V_G$ when the drain current $I_D$ of 1 μA flows (refer to FIG. 8B).

The S value of TFT is calculated by the following equation from the gate voltage change $dV_G$ and the common logarithm change d log $I_D$ of the drain current.

$$S=(dV_G/d\log I_D)$$

In this specification, the S value designates a minimum value of a curve S calculated by the above equation from a measurement curve of ($\log I_D$-$V_G$) when the drain voltage $V_D$ is 1 V.

Meanwhile, in TFT, a portion in correspondence with the bulk of MOSFET constitutes an insulator substrate and therefore, there is no dependant capacitance caused among a channel, a source, a drain and a bulk. Hence, when the drive voltage remains equal, power consumption for operation must be smaller than that in externally mounting IC. However, according to a conventional TFT, threshold voltage control is insufficient and therefore, in the case of integral formation, the drive voltage is obliged to be several times as large as that in the case of externally mounting IC and high power consumption is rather constituted. According to the present invention, by using uniform TFT having the threshold voltage of −1.0 V through 1.0 V, the drive voltage can be reduced to about one half of that of a conventional drive circuit of integral formation and there is provided a feature in which in comparison with the case of externally mounting IC, in view of power consumption, no significant disadvantage is posed.

Further, when the signal dividing circuit is constituted by using an externally mounted IC, in the case where the number of output units of a signal dividing circuit (signal division number) m is large, the number of connection lines on a substrate and outside of the substrate (normally including power source lines, signal supply lines and common constant potential lines) is significantly increased and danger of occurrence of connection failure and destruction of TFT caused by static electricity in fabrication is enhanced. The present invention achieves an advantage of being useful in avoiding the danger.

For example, think of a case in which an input digital signal represents one pixel information by 8 bits and the digital signal is divided in 8 (that is, m=8) and supplied to a drive circuit. For simplicity, no differentiation of RGB or the like is carried out and the number of the input digital lines is set to one. When a signal dividing circuit of externally mounted IC is used, the circuit needs a total of about 80 of connection lines on a substrate and outside of the substrate of 64 (8 bits×8 division) of modified digital signal lines, about 20 of other lines (signal supply lines, power source lines, common constant potential lines and so on which are necessary in operating the drive circuit). In contrast thereto, when the signal dividing circuit of TFT in integral formation is used, a total of about 40 connection lines on a substrate and outside of the substrate of 8 (8 bits) of input digital signal lines, about 30 of other lines (signal supply lines, power source lines, common constant potential lines and so on necessary for operating the signal dividing circuit and the drive circuit), are sufficient.

Further, the necessity of the signal dividing circuit and advantage of TFT formation thereof are applicable not only to a semiconductor device with a digital signal as an input signal but also to a semiconductor device with an analog signal as an input signal. However, according to the semiconductor device with an analog signal as an input signal, although the constitution of FIG. 1 is similarly adopted, content of a drive circuit and a signal dividing circuit is changed in accordance with whether an input signal is a digital signal or an analog signal. Further, particularly in the signal dividing circuit, it is indispensable to amplify input signal, however, amplification by TFT is provided with low accuracy and not practical in the case of the analog signal. In this respect, the digital signal can be amplified with high accuracy even by TFT which constitutes a considerable difference and the present invention can be realized.

DETAILED DESCRIPTION OF THE PREFERRED EMBODIMENTS

Embodiment 1

Figure 1:
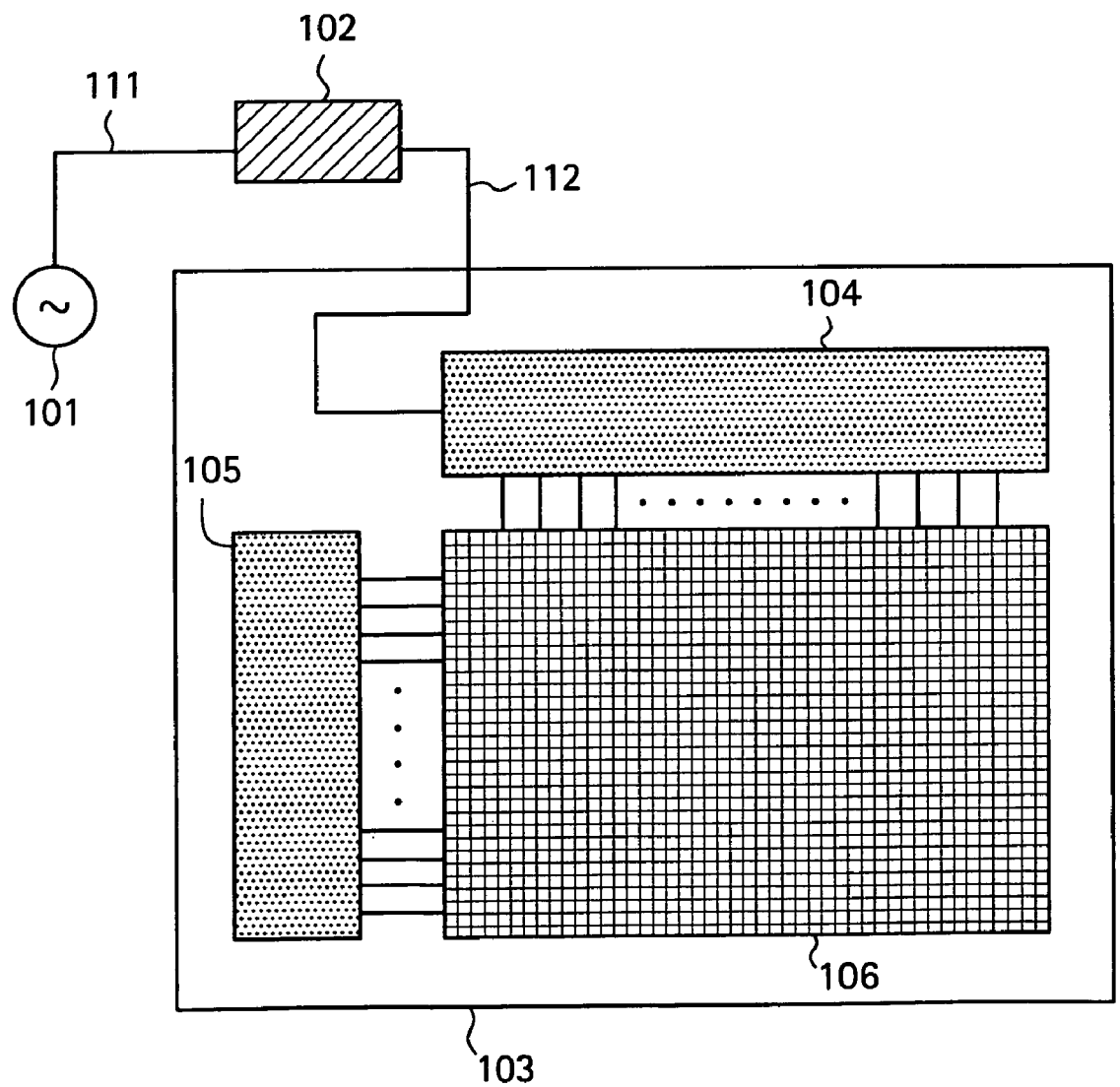
FIG. 1 is a diagram showing an outline constitution of a liquid crystal display device of an active matrix type.
Figure 2:
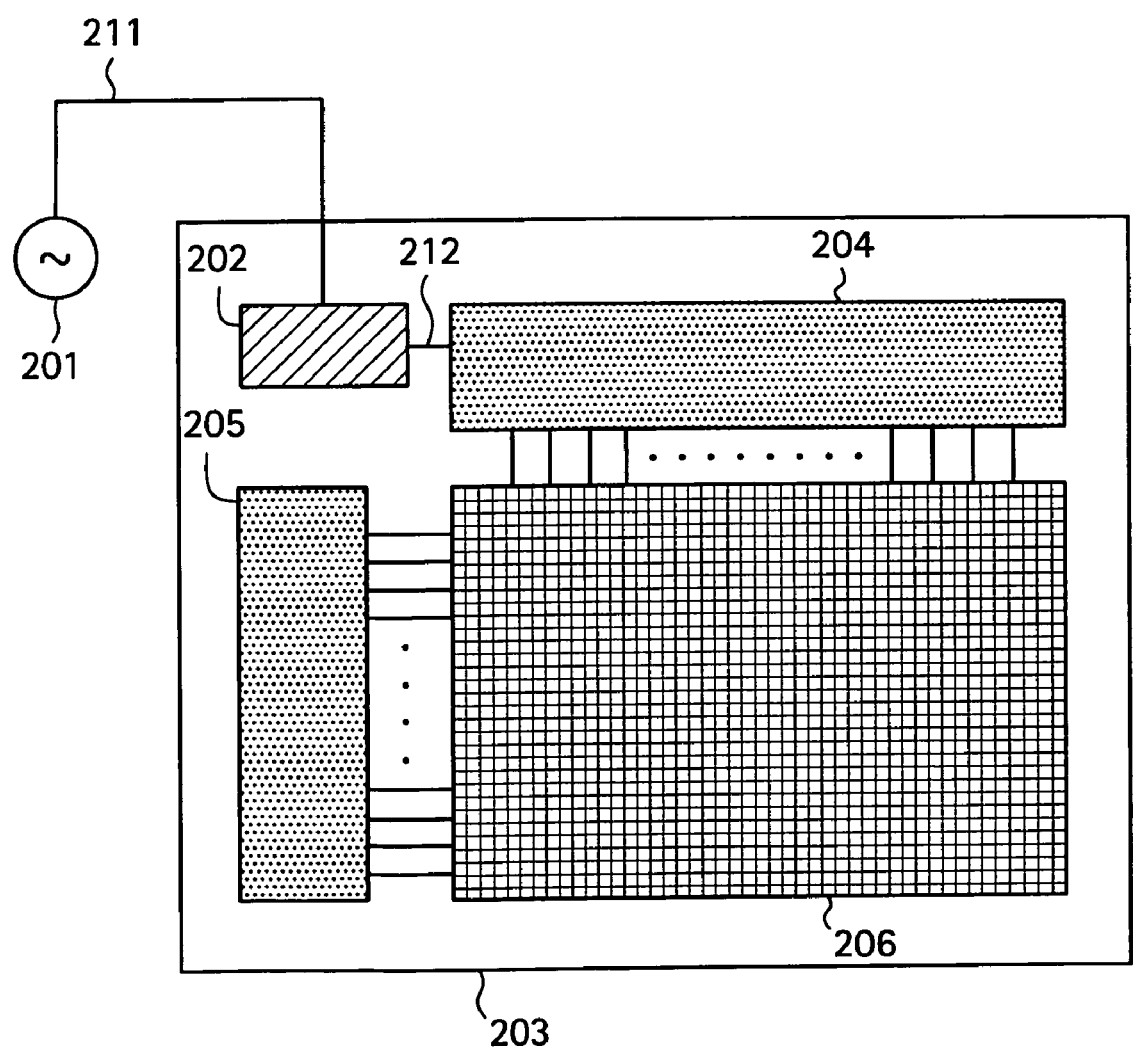
FIG. 2 is a constitution block diagram showing an embodiment according to the present invention.

FIG. 2 shows a constitution block diagram of an embodiment according to the present invention. This is an example which is applied to a liquid crystal display device with a digital signal as an input signal. A signal dividing circuit 202 is constituted by TFTs and is formed on a same substrate integrally with circuits of a pixel matrix unit 206 and a signal line drive circuit 204 and a scanning line drive circuit 205. In the FIG. 2, numeral 201 shows a digital signal source, numeral 203 shows a substrate having an insulating surface; for example, a glass, a quartz and so on. Numeral 211 shows an input digital signal line, numeral 212 shows a modified digital signal line.

Figure 3A:
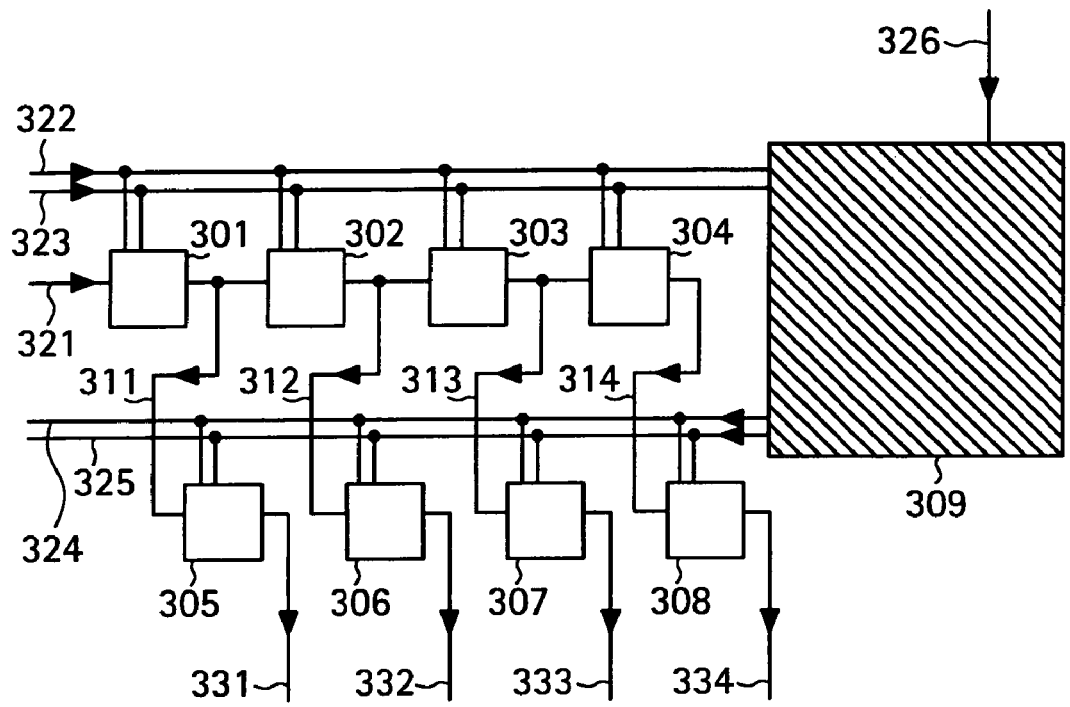
FIGS. 3A and 3B are diagrams showing a constitution of a signal dividing circuit used in the embodiment according to the present invention.
Figure 3B:
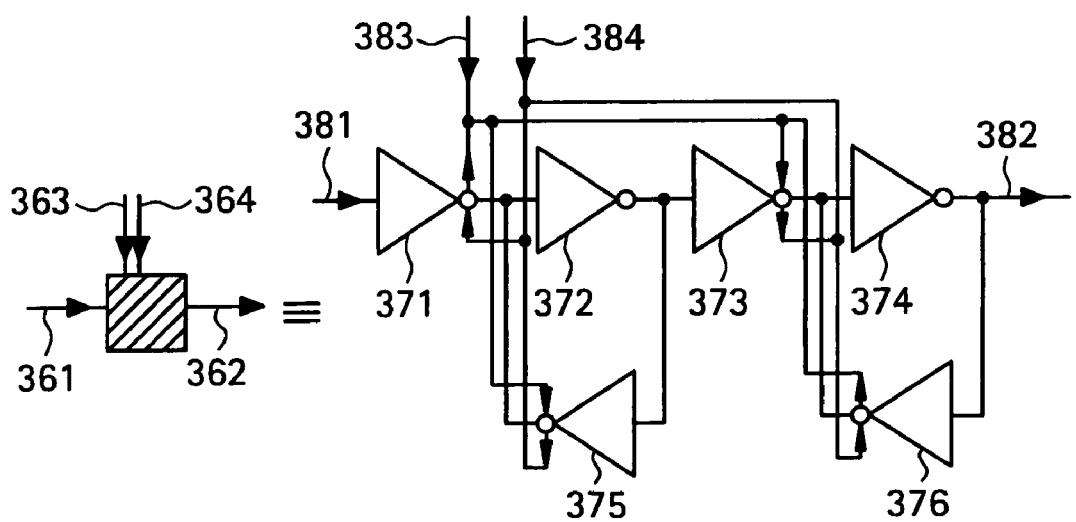

FIG. 3A shows a constitution diagram of the signal dividing circuit 202. It is assumed in the embodiment that the number n of input digital signal lines is set to 1, the number m of signal divisions is set to 4 and an input digital signal is of 80 MHz (in correspondence with picture image display under XGA standard). As shown by FIG. 3B, each of latch prestages 301 through 304 and latch poststages 305 through 308 can be constituted by 2 of inverters (372, 374) and 4 of clocked inverters (371, 373, 375, 376). A signal input portion 381 corresponds to numeral 361, a signal output portion 382 corresponds to numeral 362 and clock signal input portions 383 and 384 respectively correspond to numerals 363 and 364.

Figure 4:
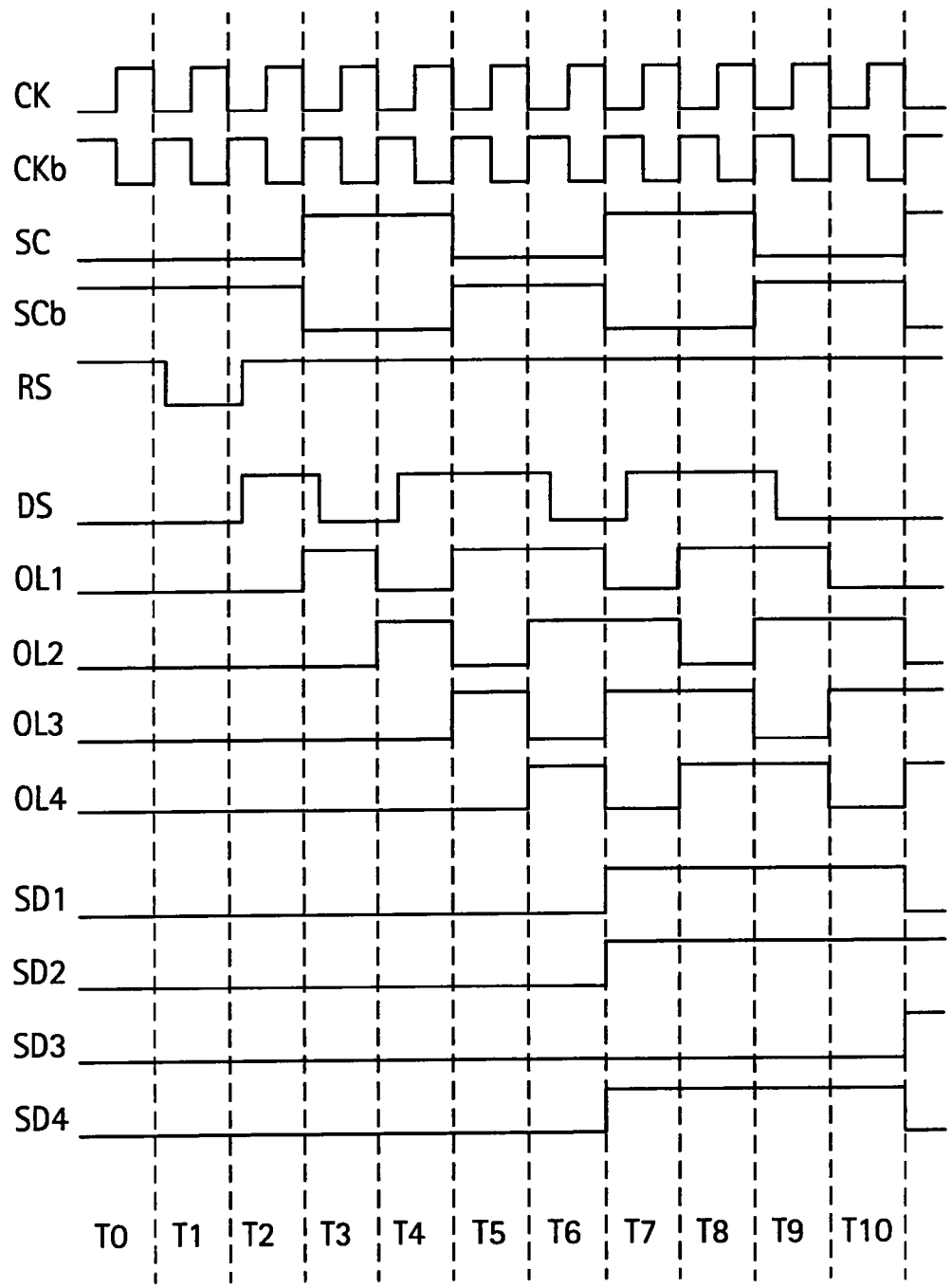
FIG. 4 shows timing charts for explaining the operation of the signal dividing circuit used in the embodiment according to the present invention.

First, an explanation will be given of the operation of the embodiment in reference to timing charts of FIG. 4. Each of time periods T0, T1, T2, T3, T4, T5, T6, T7, T8, T9 and T10 is equal to a pulse length of an input digital signal which is 12.5 ns.

A clock signal line 323 is inputted with a clock signal CK, and a clock signal line 322 is inputted with a signal CKb which is inverted from the clock signal CK. Receiving the both clock signals and a reset signal designated by RS, a counter circuit 309 outputs a modified clock signal as designated by SC to a modified clock signal line 324 and outputs a modified clock signal SCb to a modified clock signal line 325. The modified clock signal SCb is inverted from the modified clock signal SC. Numeral 326 in FIG. 3A shows a reset signal line.

An input digital signal DS is transmitted to an input portion 321 of the signal dividing circuit. Further, respective information of the input digital signal is successively transmitted from the latch prestage 301 to the latch prestage 302 and from the latch prestage 302 to the latch prestage 303 at every period of the clock signal CK or CKb. Notations OL1, OL2, OL3 and OL4 designate changes in potential of output portions 311, 312, 313 and 314 at the respective latch prestages, showing a behavior where potential information of the input digital signal is transmitted.

When the modified clock signal SC becomes negative (for example, T5 and T6), the potential information of the input digital signal held by the latch prestage 301 is transmitted not only to the latch prestage 302 but also the latch poststage 305. Similarly, the potential information of the latch prestage 302 is transmitted also to the latch poststage 306, the potential information of the latch prestage 303 is transmitted also to the latch poststage 307 and the potential information of the latch prestage 304 is transmitted to the latch poststage 308. However, at the respective latch poststages, the potential information at T5 is overwritten by the potential information which is transmitted at T6 and therefore, as a result, only the potential information at T6 remains.

By the above-described information, the modified digital signals designated by notations SD1, SD2, SD3 and SD4 are transmitted from respective modified digital signal lines 331, 332, 333 and 334 which are connected to the output portions of the respective latch poststages. Respective modified digital signals in a time period from T7 to T10 correspond to potential information of OL1 when SD1 is at T3, SD2 is at T4, SD3 is at T5 and SD4 is at T6. The pulse length of the respective modified digital signals is 50 ns (four times as much as pulse length of input digital signal).

The respective modified digital signals transmitted from the signal dividing circuit are transmitted to the signal line drive circuit 204 formed on the same substrate integrally with the signal dividing circuit via a modified digital signal line 212 similarly formed integrally on the same substrate. Although a single one of the modified digital signal line 212 is illustrated, 4 (=m×n) of the modified digital signal lines are provided.

A description will be given of an example of fabrication steps of TFT having a high quality polycrystal silicon film with the mobility of 150 $cm^2$/Vs or more which can realize the embodiment as follows. According to the steps, TFT adapted to conditions of an S value of 0.15 V/dec or lower and threshold voltage of −0.1 V through 1.0 V can be fabricated. However, in this embodiment, TFT having the mobility of 150 $cm^2$/Vs or higher which is fabricated by a method other than the following steps may naturally be used.

(Example of Fabrication Steps of TFT)

An explanation will be given here of fabrication steps by showing plane views (FIGS. 10A, 10B, 10C, 10D, 10E, 10F, 11A, 11B, 11C, 11D and 11E) and sectional views (left of FIGS. 5A, 5B, 5C, 5D, 6A, 6B, 6C, 6D, 7A, 7B and 7C) particularly with an example of TFTs in an inverter which is an element used both in a signal dividing circuit and a drive circuit among TFTs used in the embodiment. The inverter is constituted by using respective ones of n-channel TFT and p-channel TFT. Further, an explanation will be given also of pixel TFT (which uses n-channel TFT) used in a circuit of a pixel matrix unit integrally formed therewith by showing only sectional views thereof (right of FIGS. 5A, 5B, 5C, 5D, 6A, 6B, 6C, 6D, 7A, 7B and 7C).

However, in the example of steps, not only the inverter and the pixel TFT but also any electronic part which can be constituted by a thin film can be fabricated and a total of circuits of the signal dividing circuit, the drive circuit and the pixel matrix unit can integrally be formed.

FIGS. 10A, 10B, 10C, 10D, 10E, 10F, 11A, 11B, 11C, 11D and 11E are plane views viewing a substrate from above. The respective sectional views in FIGS. 5A, 5B, 5C, 5D, 6A, 6B, 6C, 6D, 7A, 7B and 7C show sections taken along broken lines 470 in FIGS. 10A, 10B, 10C, 10D, 10E, 10F, 11A, 11B, 11C, 11D and 11E.

FIGS. 10A, 10B, 10C, 10D, 10E and 10F and FIGS. 5A, 5B, 5C and 5D are referred. First, a quartz substrate 401 is prepared as a substrate having an insulating surface.

Numeral 402 designates an amorphous silicon film which is formed to constitute a final film thickness (film thickness in consideration of film reduction after thermal oxidation) of 10 through 70 nm (preferably, 50 nm). Further, it is important to thoroughly control concentrations of impurities in the film in film formation.

In the case of this example, all of concentrations of C (carbon), N (nitrogen), O (oxygen) and S (sulphur) which are representative impurities in the amorphous silicon film 402, are controlled to be less than $5 \times 10^{18}$ atoms/cm$^3$ (preferably, $1 \times 10^{18}$ atoms/cm$^3$ or less). When each of the impurities is present at a concentration more than the above-described level, adverse influence is effected in crystallization and deterioration of film quality after crystallization can be caused.

Further, the hydrogen concentration in the amorphous silicon film 402 is also a very important parameter and it seems that a film having excellent crystalline performance is provided by restraining low the hydrogen content. Therefore, it is preferable to form the amorphous silicon film 402 by a low pressure thermal CVD (Chemical Vapor Deposition) process.

Next, a step of crystallizing the amorphous silicon film 402 is carried out. As means for crystallization, a technology described in Japanese Unexamined Patent Publication No. JP-A-7-130652 is used. The JP-A-7-130652 corresponds to Ohtani et al. U.S. Pat. No. 5,643,826. An entire disclosure of the JP-A-7-130652 and the U.S. Pat. No. 5,643,826 are incorporated herein by reference. Although means in Embodiment 1 and Embodiment 2 in the U.S. Pat. No. 5,643,826 may be used, it is preferable in this example to use technological content described in the Embodiment 2. Japanese Unexamined Patent Publication No. JP-A-8-78329 explains the subject matter of the Embodiment 2 in detail. An entire disclosure of the JP-A-8-78329 is incorporated herein by reference.

Figure 5A:
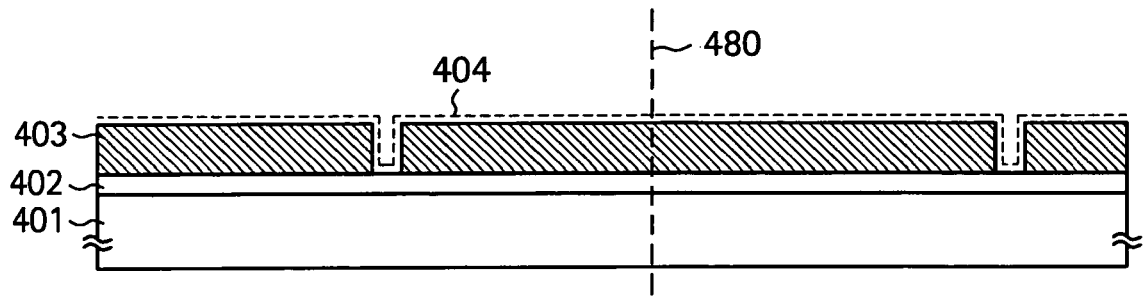
FIGS. 5A, 5B, 5C and 5D are sectional views for explaining an example of fabrication steps of TFT used in the embodiment according to the present invention.
Figure 10A:
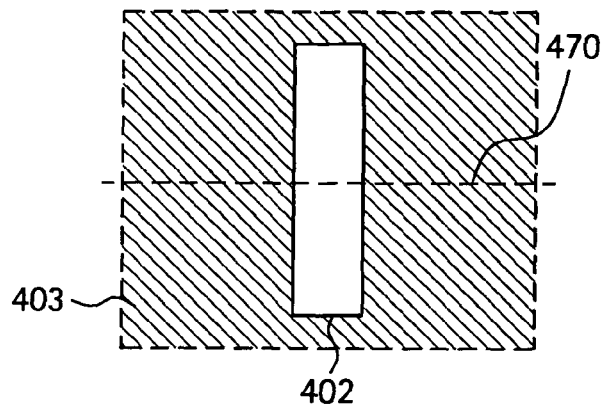
FIGS. 10A, 10B, 10C, 10D, 10E and 10F are plane views in view from above for explaining the example of fabrication steps of TFT used in the embodiment according to the present invention.

A mask insulating film 403 for selecting regions of adding a catalyst element is formed. The mask insulating film 403 is provided with openings at a plurality of locations for adding a catalyst element (FIG. 5A and FIG. 10A). A position of a crystal region can be determined by a position of the opening.

Further, a solution including nickel (Ni) as a catalyst element for promoting crystallization of the amorphous silicon film is coated by a spin coating process and an Ni including layer 404 is formed.

Next, when the step of adding the catalyst element has been finished, after expelling hydrogen at 450° C. for about 1 hour, crystallization of the amorphous silicon film 402 is carried out by performing a heating treatment for 4 through 24 hours at temperatures of 550 through 650° C. in an inert atmosphere, a hydrogen atmosphere or an oxygen atmosphere. In this example, the heating treatment is carried out for 14 hours at 570° C. in a nitrogen atmosphere.

Figure 5B:
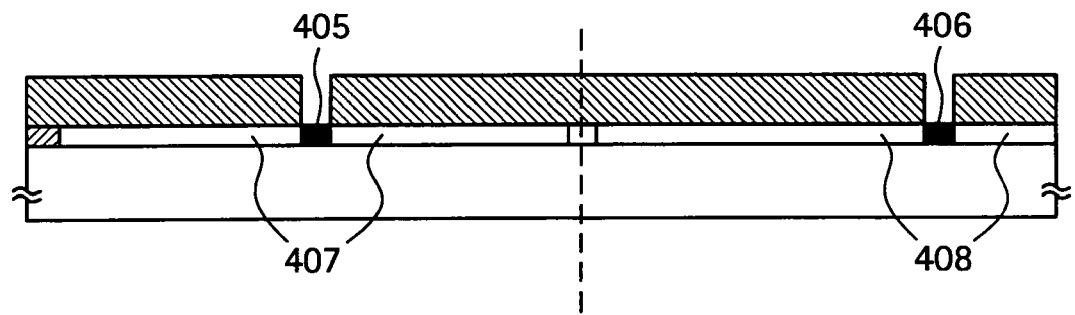
Figure 10D:
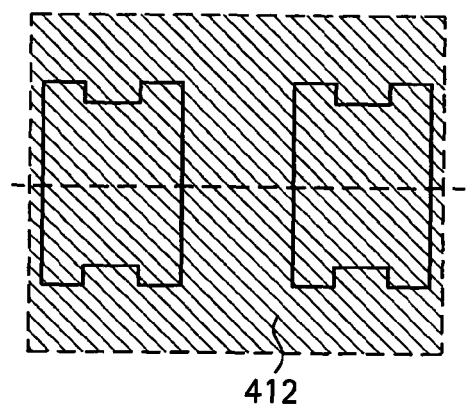
Figure 10B:
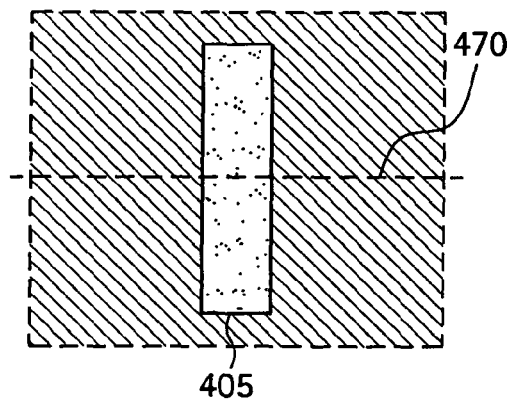

At this occasion, the crystallization of the amorphous silicon film 402 is predominantly progressed from nuclei caused at regions 405 and 406 added with nickel and crystal regions 407 and 408 which have grown substantially in parallel with a substrate face of the substrate 401 are formed (FIG. 5B and FIG. 10B). The crystal regions 407 and 408 are referred to as laterally grown regions. Individual crystals are aggregated in a comparatively aligned state in the laterally grown region and therefore, an advantage in which total crystalline performance is excellent is achieved.

Further, even when the technology described in Embodiment 1 of Japanese Unexamined Patent Publication No. JP-A-7-130652 mentioned previously is used, regions which can be microscopically referred to as laterally grown regions are formed. However, the technology has a drawback in view of controllability of grain boundaries since nuclei occur nonuniformly in a face.

Figure 5C:
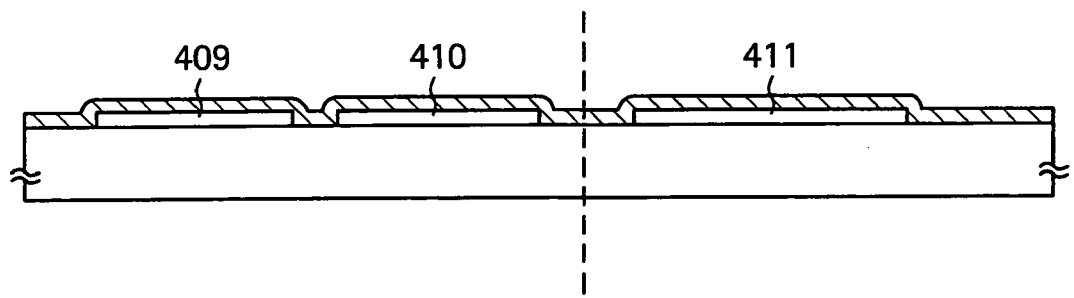
Figure 10E:
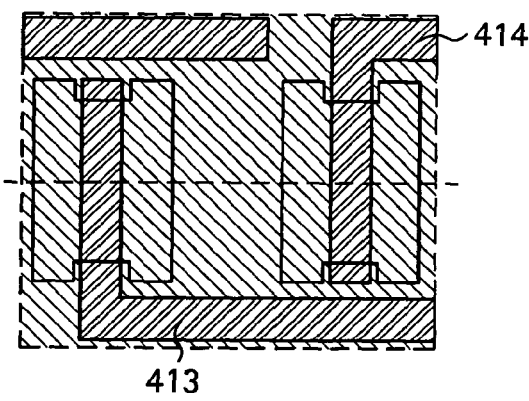
Figure 10C:
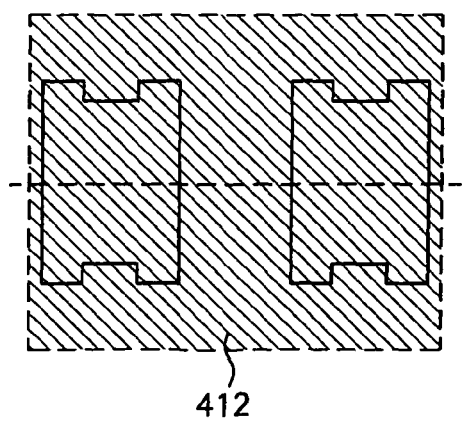

When the heating treatment for crystallization has been finished, the mask insulating film 403 is removed, patterning is carried out and land-like semiconductor layers (activation layers) 409, 410 and 411 comprising the laterally grown regions 407 and 408 are formed (FIG. 5C and FIG. 10C).

In this case, numeral 409 designates an activation layer of N-type TFT constituting a signal dividing circuit or a drive circuit, numeral 410 designates an activation layer of P-type TFT thereof and numeral 411 designates an activation layer of N-type TFT (pixel TFT) constituting a pixel matrix circuit.

When the activation layers 409, 410 and 411 have been formed, a gate insulating film 412 comprising an insulating film including silicon is formed thereon.

Figure 5D:
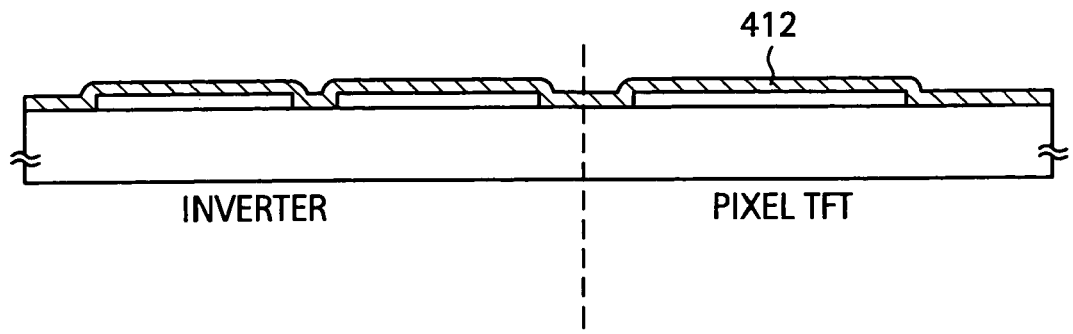

Further, as shown by FIG. 5D and FIG. 10D, a heating treatment for removing or reducing the catalyst element (nickel) (gettering process of catalyst element) is carried out. According to the heating treatment, a halogen element is included in a treatment atmosphere and an effect of gettering the metal element by the halogen element is utilized.

Further, in order to sufficiently achieve the gettering effect by the halogen element, it is preferable to carry out the heating treatment at temperatures exceeding 700° C. When the temperature is below 700° C., decomposition of a halogen compound in the treatment atmosphere may become difficult and the gettering effect may not be provided.

In this example, the heating treatment is carried out for 30 minutes at 950° C. in an atmosphere in which hydrogen chloride (HCl) is included by a concentration of 3 volumetric % in an oxygen atmosphere. When the concentration of HCl is 10 volumetric % or higher, irregularities of about the film thickness are caused on surfaces of the activation layers 409, 410 and 411 which is not preferable.

It seems that in this step, nickel in the activation layers 409, 410 and 411 is gettered by operation of chlorine, converted into volatile nickel chloride and is removed to separate into the atmosphere. Further, by this step, the concentration of nickel in the activation layers 409, 410 and 411 is reduced to $5 \times 10^{17}$ atoms/cm$^3$ or lower.

Further, by the heating treatment, thermal oxidation reaction is progressed at interfaces between the activation layers 409, 410 and 411 and the gate insulating film 412 and the film thickness of the gate insulating film 412 is increased by an amount of a thermally oxidized film. When the thermally oxidized film is formed in this way, an interface between semiconductor and insulating film having a very low interfacial level can be provided. Further, there also is achieved an effect of preventing failure of forming the thermally oxidized film at an end portion of the activation layer (edge thinning).

Further, it is also effective to achieve promotion of film quality of the gate insulating film 412 by carrying out a heating treatment for about 1 hour at 950° C. in a nitrogen atmosphere after carrying out the above-described heating treatment in the halogen atmosphere.

Figure 6A:
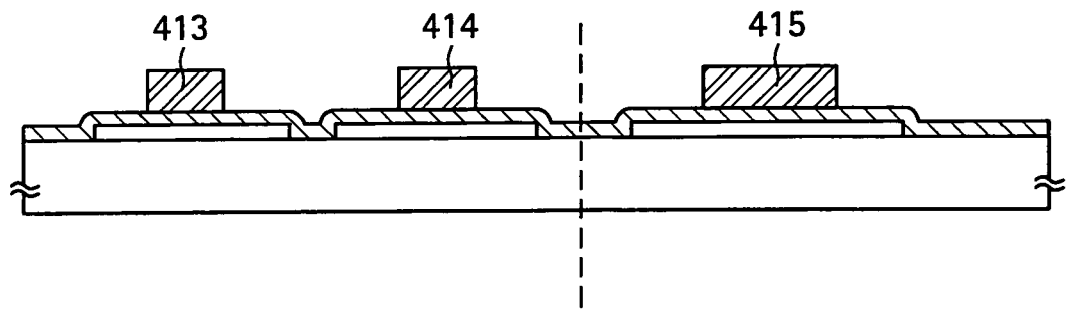
FIGS. 6A, 6B, 6C and 6D are sectional views for explaining the example of fabrication steps of TFT used in the embodiment according to the present invention.

Next, FIGS. 10E, 10F, 11A, 11B, 11C, 11D, 11E, 6A, 6B, 6C and 6D are referred. A metal film whose major component is aluminum which is not illustrated is formed and prototypes 413, 414 and 415 of gate electrodes, mentioned later, are formed by patterning. In this example, an aluminum film including 2 wt % of scandium is used (FIG. 6A and FIG. 10E).

Figure 10F:
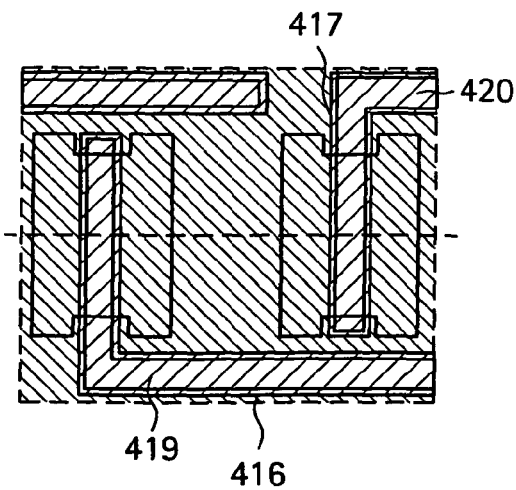

Next, porous anodized films 416, 417 and 418, poreless anodized films 419, 420 and 421 and gate electrodes 422, 423 and 424 are formed by a technology described in Japanese Unexamined Patent Publication No. JP-A-7-135318, which corresponds to Zhang et al. U.S. Pat. No. 5,648,277. An entire disclosure of JP-A-7-135318 and U.S. Pat. No. 5,648,277 are incorporated herein by reference (FIG. 6B and FIG. 10F).

Figure 6B:
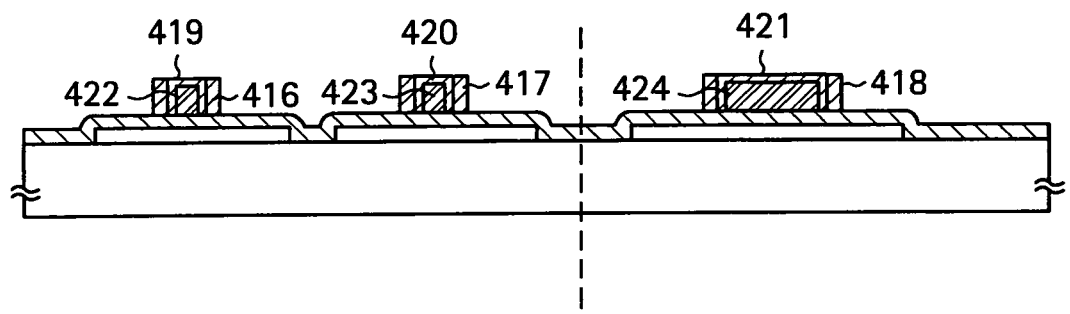
Figure 6C:
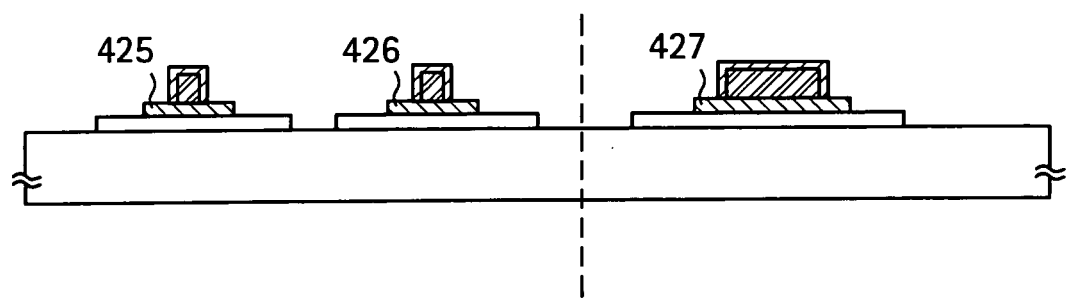

When the state of FIG. 6B is provided in this way, next, the gate insulating film 412 is etched with the gate electrodes 422, 423 and 424 and the porous anodized films 416, 417 and 418 as masks. A state of FIG. 6C (FIG. 11A in plane view) is provided by removing the porous anodized films 416, 417 and 418. Further, numerals 425, 426 and 427 shown in FIG. 6C designate gate insulating films after fabrication.

Figure 6D:
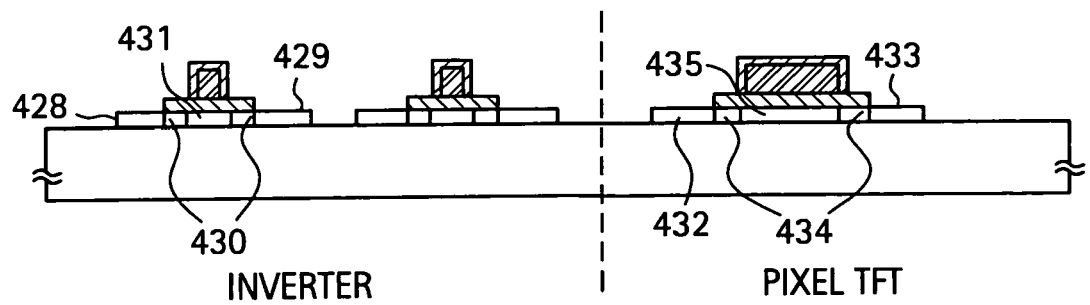
Figure 11A:
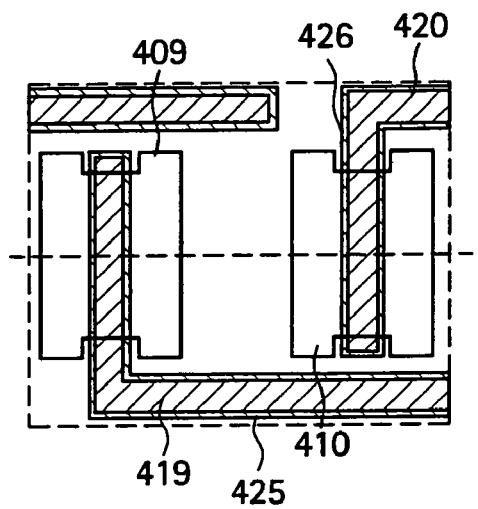
FIGS. 11A, 11B, 11C, 11D and 11E are plane views in view from above for explaining the example of fabrication steps of TFT used in the embodiment according to the present invention.
Figure 11D:
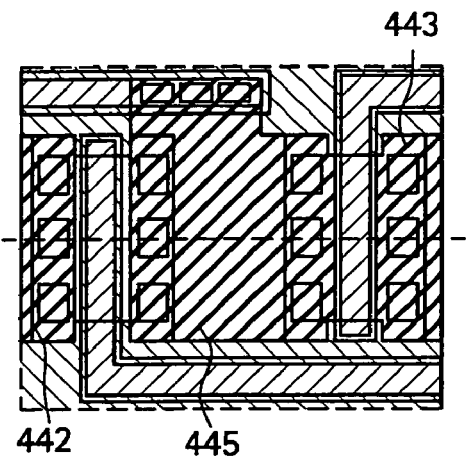
Figure 11B:
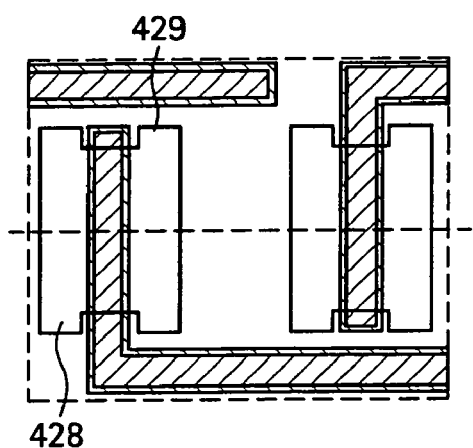

Next, in a step shown by FIG. 6D and FIG. 11B, an impurity element for providing one conductivity is added. As the impurity, P (phosphorus) or As (arsenic) may be used in the case of N type and B (boron) may be used in the case of P type.

In this example, addition of impurity is carried out in two steps. First, a first impurity addition (P (phosphorus) is used in this example) is carried out at high acceleration voltage of about 80 keV and n$^-$ regions are formed. The n$^-$ region is adjusted such that a P ion concentration becomes $1 \times 10^{18}$ atoms/cm$^3$ through $1 \times 10^{19}$ atoms/cm$^3$.

Further, a second impurity addition is carried out at a low acceleration voltage of 10 keV and n$^+$ regions are formed. In this case, the acceleration voltage is low and accordingly, the gate insulating film functions as a mask. Further, the n$^+$ region is adjusted such that sheet resistance becomes 500 Ω/square or lower (preferably, 300 Ω/square or lower).

After having been processed by the above-described steps, a source region 428, a drain region 429, low concentration impurity regions 430 and a channel forming region 431 of the N-type TFT constituting the signal dividing circuit or the drive circuit are formed. Further, a source region 432, a drain region 433, low concentration impurity regions 434 and a channel forming region 435 of the N-type TFT constituting the pixel TFT are determined (FIG. 6D and FIG. 11B).

In the state of the FIG. 6D and FIG. 11B, each of the gate electrodes 413, 414 and 415 is not necessarily covered with an anodized film.

Further; in the state shown by FIG. 6D, the activation layer of the P-type TFT for constituting the signal dividing circuit or the drive circuit is provided with a constitution the same as that of the activation layer of the N-type TFT.

Figure 7A:
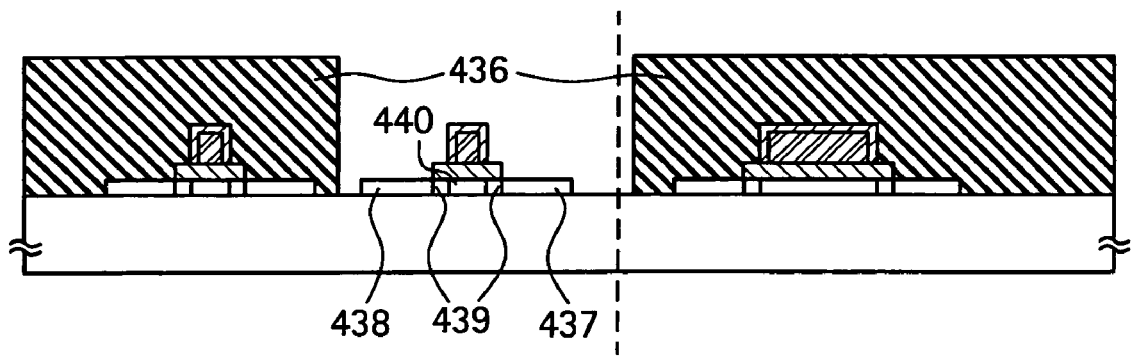
FIGS. 7A, 7B and 7C are sectional views for explaining the example of fabrication steps of TFT used in the embodiment according to the present invention.
Figure 7B:
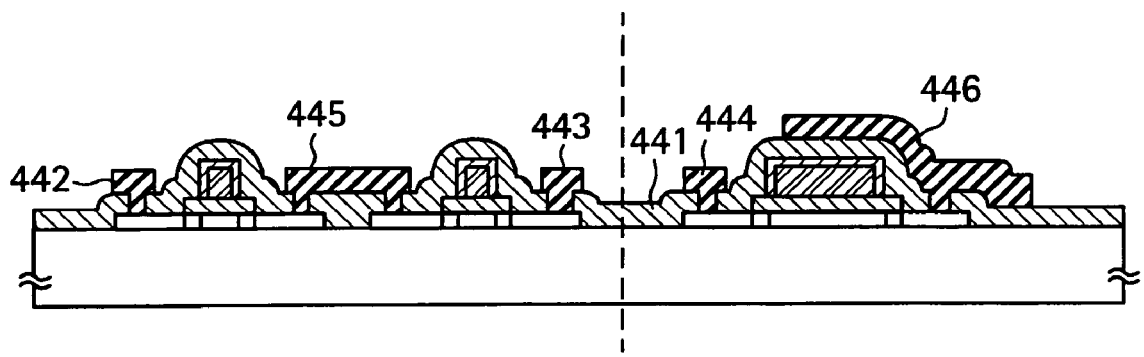

Next, FIGS. 11C, 11D and 11E and FIGS. 7A, 7B and 7C are referred. As shown by FIG. 7A (FIG. 11C in plane view), a resist mask 436 is provided to cover the N-type TFTs and impurity ions for providing P type (boron is used in this example) are added.

Although the steps are carried out twice similar to the above-described impurity adding steps, the N type needs to revert to P type and therefore, B (boron) ions having a concentration about several times as much as the concentration of adding of P ions mentioned above are added.

Figure 11E:
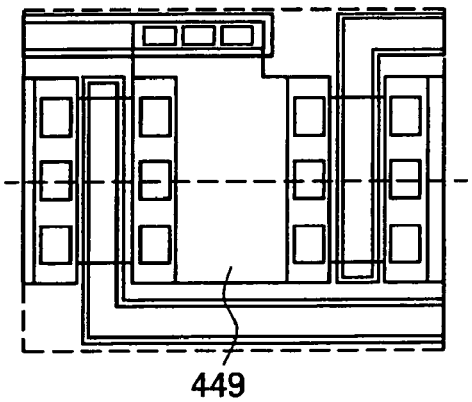
Figure 11C:
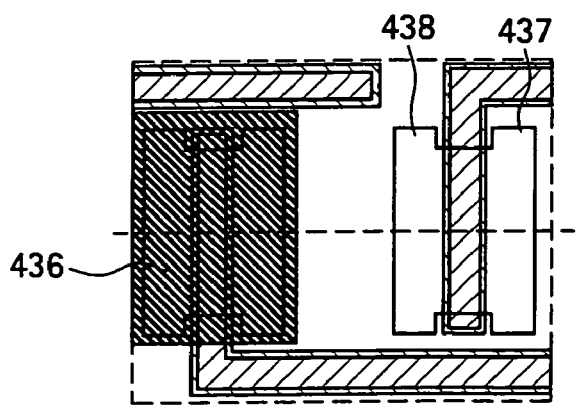

In this way, a source region 438, a drain region 437, low concentration impurity regions 439 and a channel forming region 440 are formed (FIG. 7A and FIG. 11C).

When the activation layers are completed as described above, the impurity ions are activated by a combination of furnace annealing, laser annealing, lamp annealing and so on. At the same time, damage of the activation layers suffered in the addition steps is repaired.

Next, a laminated layer of a silicon oxide film and a silicon nitride film is formed as an interlayer insulating film 441. Further, after forming contact holes in the interlayer insulating film 441, source electrodes 442, 443 and 444 and drain electrodes 445 and 446 are formed to provide a state shown by FIG. 7B and FIG. 11D.

Figure 7C:
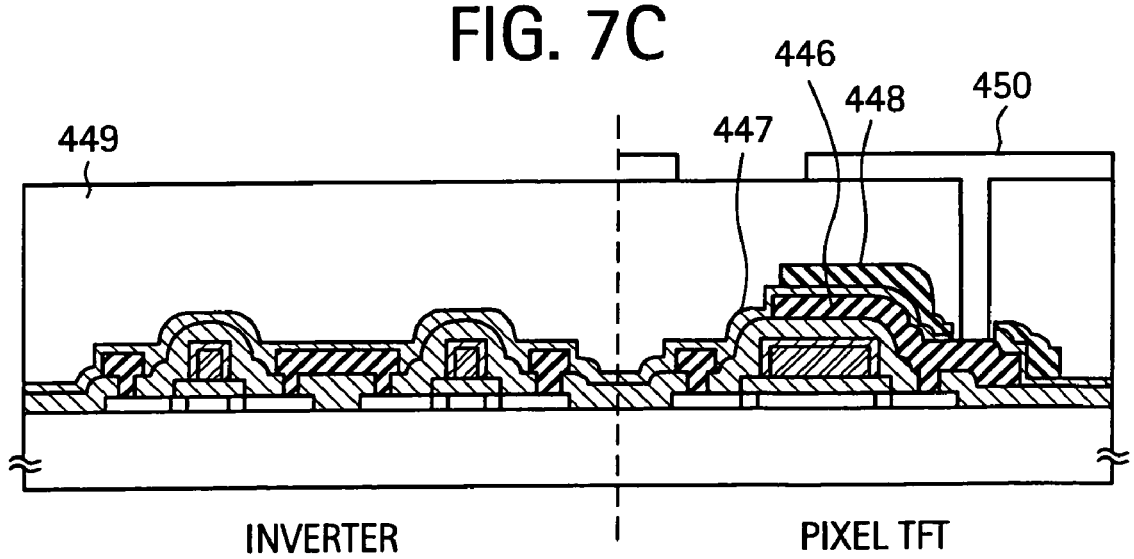
Figure 8A:
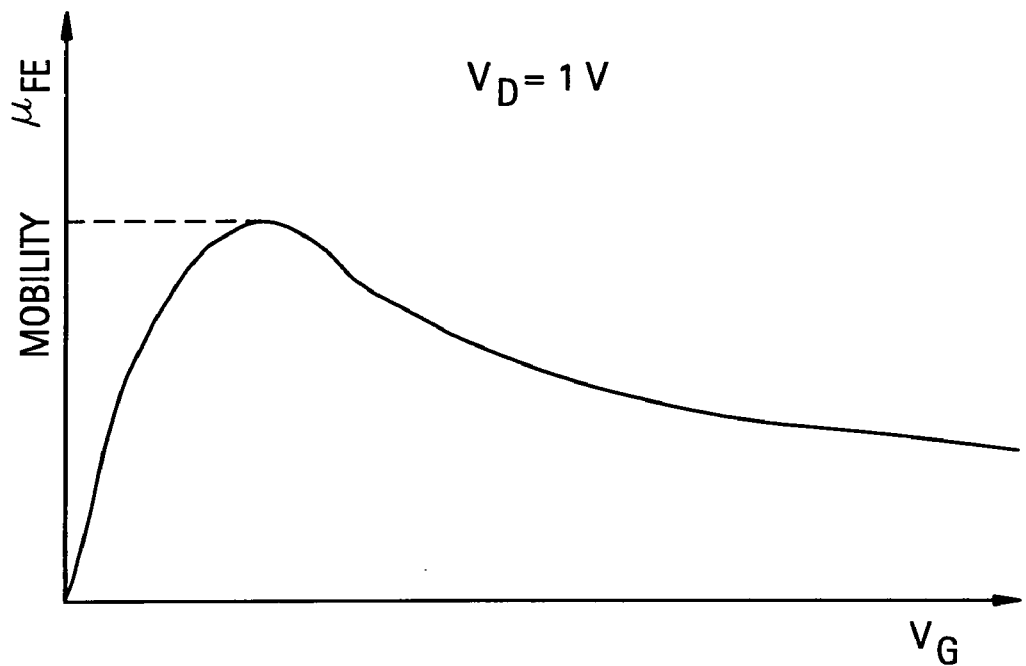
FIGS. 8A and 8B are diagrams showing methods of determining mobility and threshold voltage.
Figure 8B:
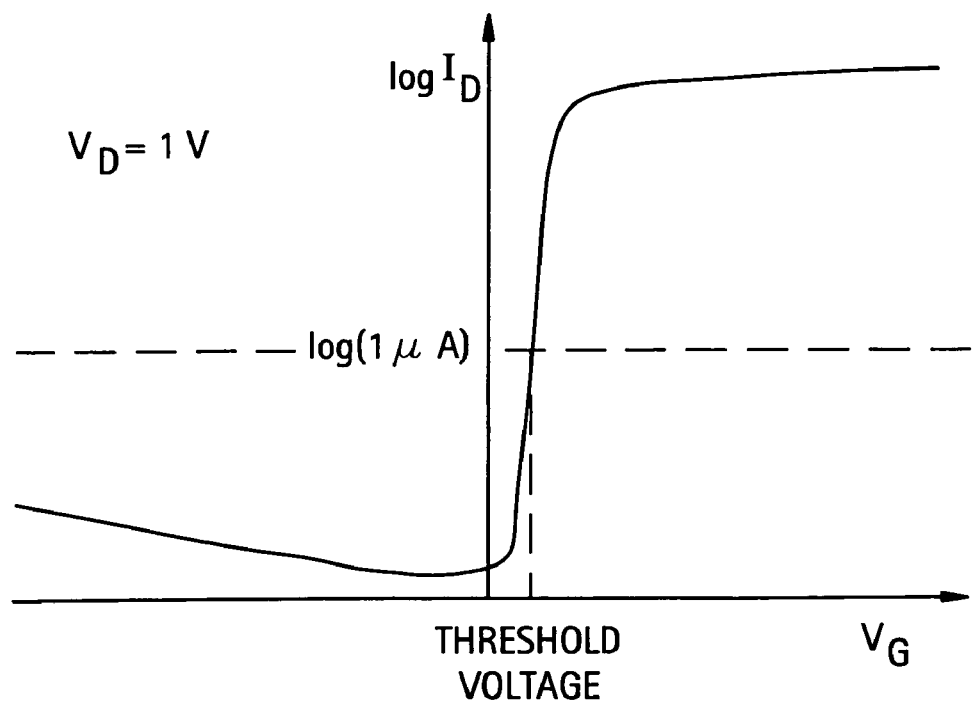
Figure 9:
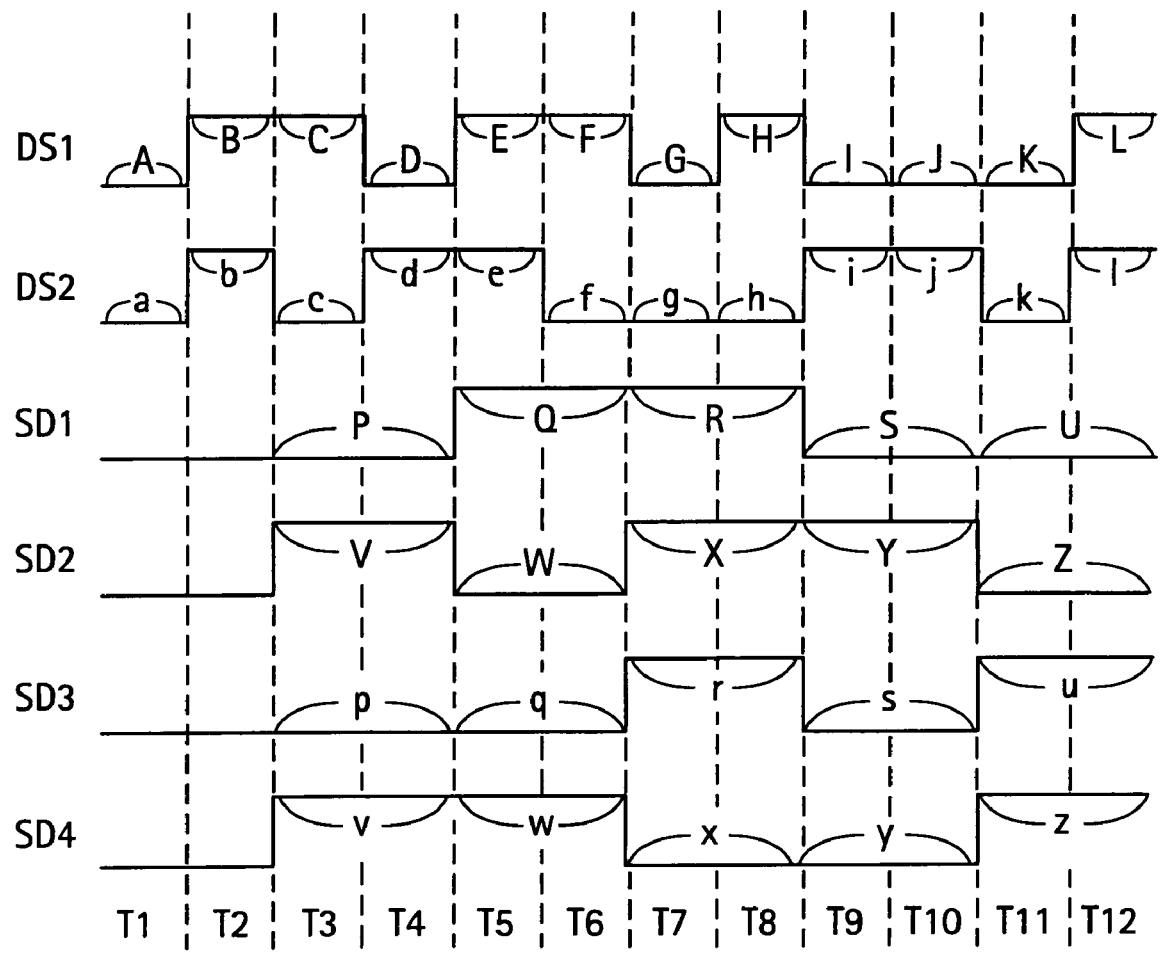
FIG. 9 shows timing charts for explaining the operation of a signal dividing circuit.

Next, a second interlayer insulating film 447 comprising an organic resin film is formed by a thickness of 0.5 through 5 μm (FIG. 7C and FIG. 11E). As the organic resin film, polyimide, acrylic resin, polyamide, polyimideamide or the like can be used. As advantages of using the organic resin film for the second interlayer insulating film 447, there are pointed out 1) film forming method is simple, 2) film thickness can be easily thickened, 3) parasitic capacitance can be reduced since relative dielectric constant is low, 4) flatness is excellent and so on.

Next, a silicon nitride film having a thickness of 10 through 50 nm and a black mask 448 are formed. The silicon nitride film is not drawn in the FIG. 7C. Further, a third interlayer insulating film 449 comprising a silicon oxide film or a silicon nitride film or an organic resin film or a laminated film of these is formed by a thickness of 0.1 through 3 μm. Further, contact holes are formed in the interlayer insulating film 449 and a formed conductive film is patterned by which a pixel electrode 450 is formed. This example is an example of a transmission type and therefore, a transparent conductive film of ITO (Indium Tin Oxide) or the like is used as a conductive film for constituting the pixel electrode 450 (FIG. 7C and FIG. 11E).

According to the constitution of FIG. 7C, an auxiliary capacitor is formed at a region in which the pixel electrode 450 and the black mask 448 overlap via the interlayer insulating film 449.

Further, according to the constitution shown by FIG. 7C, the opening rate can be prevented from being lowered by forming the auxiliary capacitor which is liable to occupy a large area on TFT. Further, when a silicon nitride film having high dielectric constant is used by a thickness of about 25 nm, a very large capacitance can be ensured with a small area.

Next, a total of the substrate is heated for 1 through 2 hours at 350° C. in a hydrogen atmosphere and hydrogenation of a total of the element is carried out by which dangling bonds (unpaired bond elements) in the films (particularly, in activation layer) are compensated. After having been processed by the above-described steps, circuits of the signal dividing circuit, the drive circuit and the pixel matrix unit can be fabricated.

By the above-described steps, the applicant of the present invention could fabricate TFT having characteristics of a field effect mobility of holes of 150 cm$^2$/Vs or higher, an S value of 0.15 V/dec or lower and threshold voltage of −1.0 V through 0.0 V in the case of p-channel TFT and TFT having characteristics of a field effect mobility of electrons of 150 cm$^2$/Vs or higher, an S value of 0.15 V/dec or lower and threshold voltage of 0.0 V through 1.0 V in the case of n-channel TFT.

At this stage, an explanation will be given of the semiconductor thin film fabricated by the fabrication method of the embodiment. According to the fabrication method of the embodiment, a crystal silicon film referred to as Continuous Grain Silicon (CGS) can be provided by crystallizing the amorphous silicon film.

The laterally grown region of the semiconductor thin film provided by the fabrication method of the embodiment shows a singular crystal structure comprising an aggregation of rod-like or flat rod-like crystals. A description will be given of the feature as follows.

(Knowledge in Respect of Crystal Structure of Activation Layer)

The laterally grown region formed in accordance with the above-described fabrication steps is microscopically provided with a crystal structure in which a plurality of rod-like (or flat rod-like) crystals are aligned substantially in parallel with a regularity in a specific direction. This can be confirmed by observation by TEM (Transmission-type Electron Microscope Method).

Figure 12A:
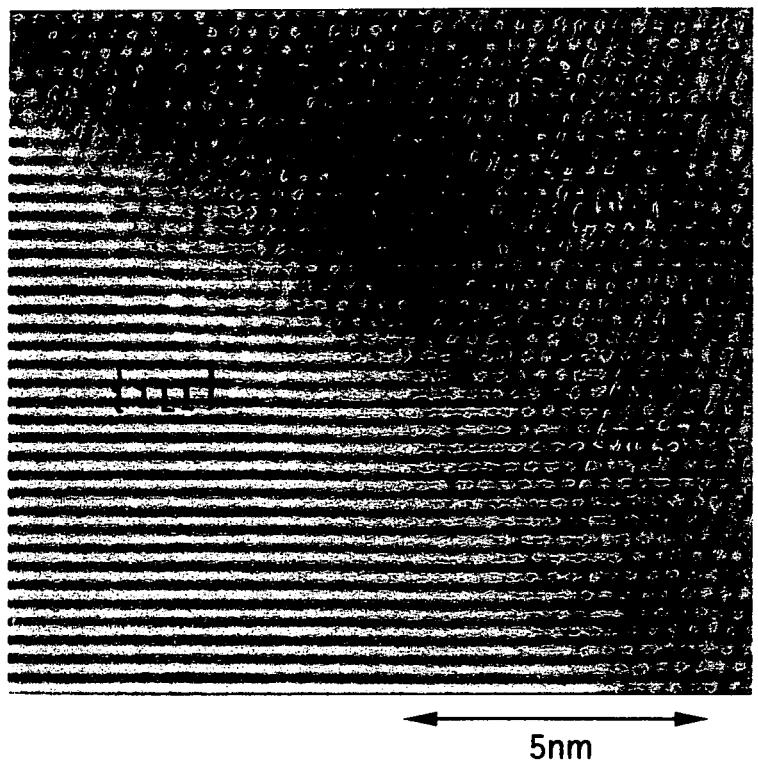
FIGS. 12A and 12B are HR-TEM photograph views enlarging crystal grain boundaries of a semiconductor thin film.

Further, the inventors have observed in details a grain boundary of the semiconductor thin film provided by the above-described fabrication method by enlarging it by a magnification of 8 million by using HR-TEM (High Resolution Transmission-type Electron Microscope Method) (FIG. 12A). Incidentally, in this specification, the grain boundary is defined to indicate a grain boundary formed at a boundary at which different rod-like crystals are brought into contact with each other unless specified otherwise. Accordingly, the above-specified grain boundary is considered to differentiate from a grain boundary in a macroscopic meaning which is formed by colliding separate laterally grown regions with each other.

Incidentally, HR-TEM (High Resolution Transmission-type Electron Microscope Method) mentioned above is a method of irradiating an electron beam orthogonally to a sample and evaluating an arrangement of atoms or molecules by utilizing interference among transmitted electrons or elastically scattered electrons. By using the method, an arrangement state of a crystal lattice can be observed as lattice stripes. Therefore, by observing the grain boundary, a bonding state of atoms at the grain boundary can be reckoned.

According to a TEM photograph (FIG. 12A) provided by the applicant, a state where different two crystal grains (rod-like crystal grain) are brought into contact with each other at a grain boundary is clearly observed. Further, at this occasion, it has been confirmed by electron beam diffraction that the two crystal grains are substantially in {110} orientation although more or less shift is included in crystal axes.

Meanwhile, according to observation of the lattice stripes by the TEM photograph mentioned above, lattice stripes in correspondence with {111} plane are observed in {110} plane. Further, the lattice stripes in correspondence with {111} plane indicate lattice stripes in which when a crystal grain is cut along the lattice stripe, {111} plane emerges at the section. To what face the lattice stripes correspond can be confirmed by a distance between the lattice stripes in a simplified way.

At this occasion, the applicant has obtained very interesting knowledge as a result of observing in details the TEM photograph of the semiconductor thin film provided by the above-described fabrication method. Lattice stripes in correspondence with {111} plane are observed in both of the two different crystal grains seen in the photograph. Further, it has been observed that the corresponding lattice shapes are clearly extended in parallel with each other.

Further, regardless of presence of the grain boundary, the lattice stripes of the two different crystal grains are connected with each other to cross the grain boundary. That is, it can be confirmed that almost all of the lattice stripes which are observed to cross the grain boundary are linearly connected with each other in spite of the fact that they are the lattice stripes of the different crystal grains. The same goes with an arbitrary grain boundary and 90% or more (typically, 95% or more) of a total of the lattice stripes maintain continuity at crystal grains.

Such a crystal structure (exactly speaking, structure of grain boundary) indicates that two different crystal grains are bonded with each other with extremely excellent commensurating performance at a grain boundary. That is, crystal lattices are continuously connected at a grain boundary and trap level caused by crystal defect or the like is very difficult to constitute. In other words, the continuity is provided to crystal lattices at the grain boundary.

Figure 12B:
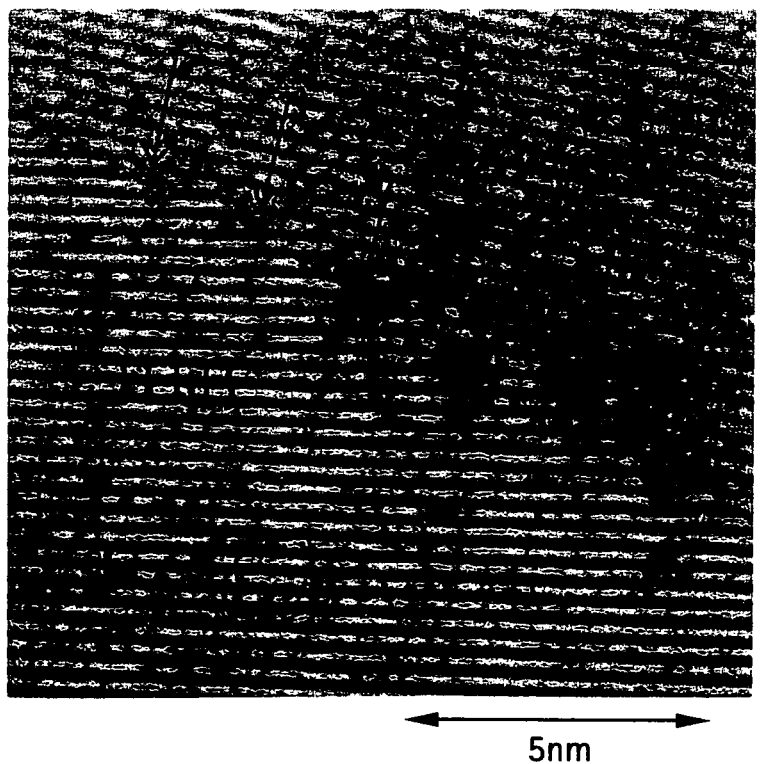

Further, FIG. 12B shows an analysis by electron beam diffraction and HR-TEM observation which is carried out by the applicant in respect of a conventional polycrystal silicon film (so-to-speak high temperature polysilicon film) as a reference. As a result, in different two crystal grains, respective lattice stripes are extended quite at random and there is almost no bonding which is continuous with excellent commensurating performance at a grain boundary. That is, it has been clarified that there are many portions where the lattice stripes are interrupted and many crystal defects at the grain boundary. At such a portion, unbonded elements are present and movement of carriers is highly probably hampered as a trap level.

The applicant refers a bonding state of atoms when lattice stripes correspond with each other with excellent commensurating performance as in the semiconductor thin film provided by the above-described fabrication method and refers a bond element at this occasion as a commensurating bond element. Further, conversely, a bonding state of atoms when lattice stripes do not correspond with excellent commensurating performance as is frequently observed in a conventional polycrystal silicon film, is referred to as incommensurating bond and a bond element at this occasion is referred to as an incommensurating bond element (or unpaired bond element).

The semiconductor thin film applied in the present invention is extremely excellent in commensurating performance at a grain boundary and accordingly, there are extremely few incommensurating bond elements mentioned above. As a result of investigation by the inventors on an arbitrary plurality of grain boundaries, a rate of presence of incommensurating bond elements to a total of bond elements has been 10% or lower (preferably, 5% or lower, more preferably, 3% or lower). That is, 90% or more (preferably, 95% or more, more preferably, 97% or more) of a total of bond elements are constituted by commensurating bond elements.

Figure 13A:
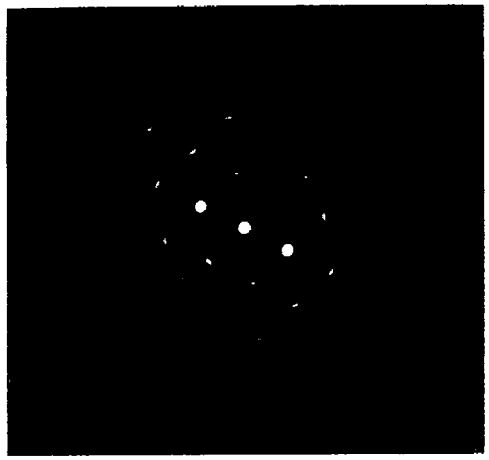
FIGS. 13A, 13B and 13C are photograph views and a schematic view of an electron diffraction pattern.

Further, FIG. 13A shows a result of observing the laterally grown region fabricated in accordance with the above-described fabrication method by electron beam diffraction. Further, FIG. 13B shows an electron beam diffraction pattern of a conventional polysilicon film (referred to as high temperature polysilicon film) for comparison.

Next, FIG. 13A shows a result of investigating a crystalline silicon film by the fabrication method of the embodiment by electron beam diffraction. In this case, FIG. 13A shows a representative electron beam diffraction pattern of the crystalline silicon film according to the present invention and FIG. 13B shows a representative electron beam diffraction pattern of a conventional high temperature polysilicon film as a reference.

Figure 13B:
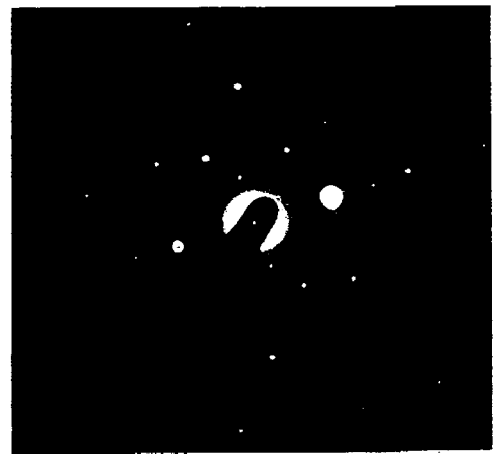

Further, in FIGS. 13A and 13B, measurement is carried out with a diameter of an irradiation spot of electron beam as 1.35 µm and accordingly, information of a region which is sufficiently macroscopic in comparison with a lattice stripe level may be considered to obtain.

Figure 13C:
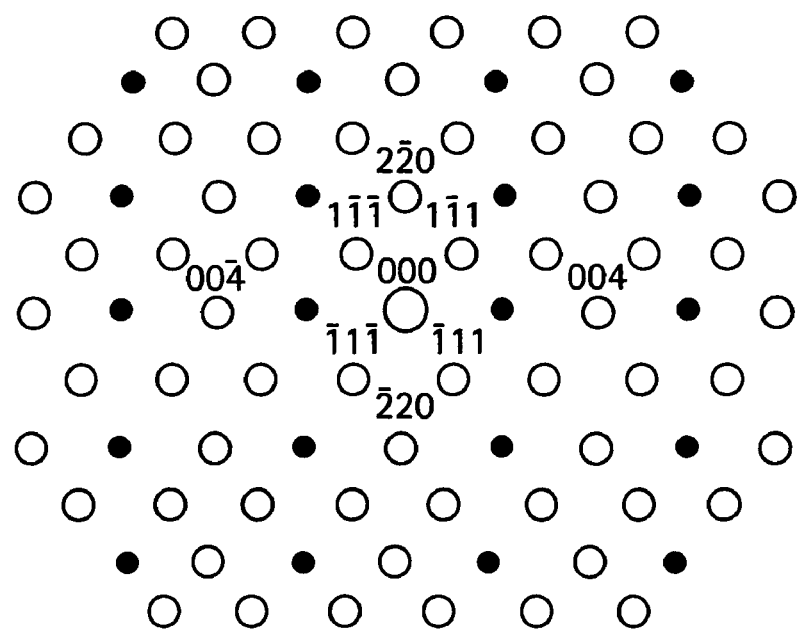

Further, FIG. 13C shows an electron beam diffraction pattern when electron beam is irradiated orthogonally to {110} plane of a single crystal silicon. Normally, what is the orientation of an observed sample is predicted by comparing such an electron beam diffraction pattern with a result of observation.

In the case of FIG. 13A, diffraction spots in correspondence with <110> incidence as shown by FIG. 13C are observed comparatively clearly and it can be confirmed that the crystal axis is <110> axis (crystal plane is {110} plane).

Further, although each of the spots is slightly provided with a spread in a shape of a concentric circle, it is anticipated that this is because there is provided a distribution of a rotational angle to some degree around the crystal axis. The degree of the spread is within 5° by estimation from the pattern.

Further, among a number of times of observation, there are cases in which the diffraction spots are not partially observed (even in FIG. 13A, diffraction spots are not partially observed). Probably, although the orientation is substantially {110} orientation, diffraction pattern is not observed since the crystal axis is slightly shifted.

The inventor predicts that the shift of the rotational angle around <111> axis causes such a phenomenon based on the fact that {111} plane is included in the crystal plane almost necessarily.

Meanwhile, in the case of the electron beam diffraction pattern shown by FIG. 13B, no clear regularity is observed in diffraction spots and it can be confirmed that crystals are oriented substantially at random. That is, it is anticipated that crystals having plane orientation other than {110} plane are irregularly mixed.

As shown by these results, the feature of crystalline silicon film according to the present invention resides in that almost all of crystal grains are oriented substantially in {110} plane and continuity is provided to lattices at a grain boundary. The feature is not provided to a conventional polysilicon film.

As described above, the semiconductor thin film fabricated by the above-described fabrication steps is a semiconductor thin film having a crystal structure (exactly speaking, structure of grain boundary) which is totally different from that of a conventional semiconductor thin film. An explanation has been given by the inventors of the semiconductor thin film utilized in the present invention also in Japanese Patent Application Nos. 9-55633, 9-165216 and 9-212428, which correspond to pending U.S. patent application Ser. Nos. 09/027,344, 09/084,738 and 09/120,290 respectively. An entire disclosure of the Japanese Patent Applications and corresponding U.S. patent applications are incorporated herein by reference.

Further, the applicant carries out X-ray diffraction in accordance with a method described in Japanese Unexamined Patent Publication No. JP-A-7-321339 and calculates a rate of orientation in respect of the crystalline silicon film according to the above-described fabrication method. The JP-A-7-321339 is incorporated herein by reference. According to the publication, the rate of orientation is defined by a calculation method shown by the following Equation 1.

{220} orientation existence ratio=1 (constant)

{111} orientation existence ratio=(relative intensity of {111} to {220} of sample)/(relative intensity of {111} to {220} of powder)

{311} orientation existence ratio=(relative intensity of {311} to {220} of sample)/(relative intensity of {311} to {220} of powder)

{220} orientation rate=({220} orientation existence ratio)/[{220} orientation existence ratio)+{111} orientation existence ratio)+{311} orientation existence ratio)]   (Equation 1)

Figure 17:
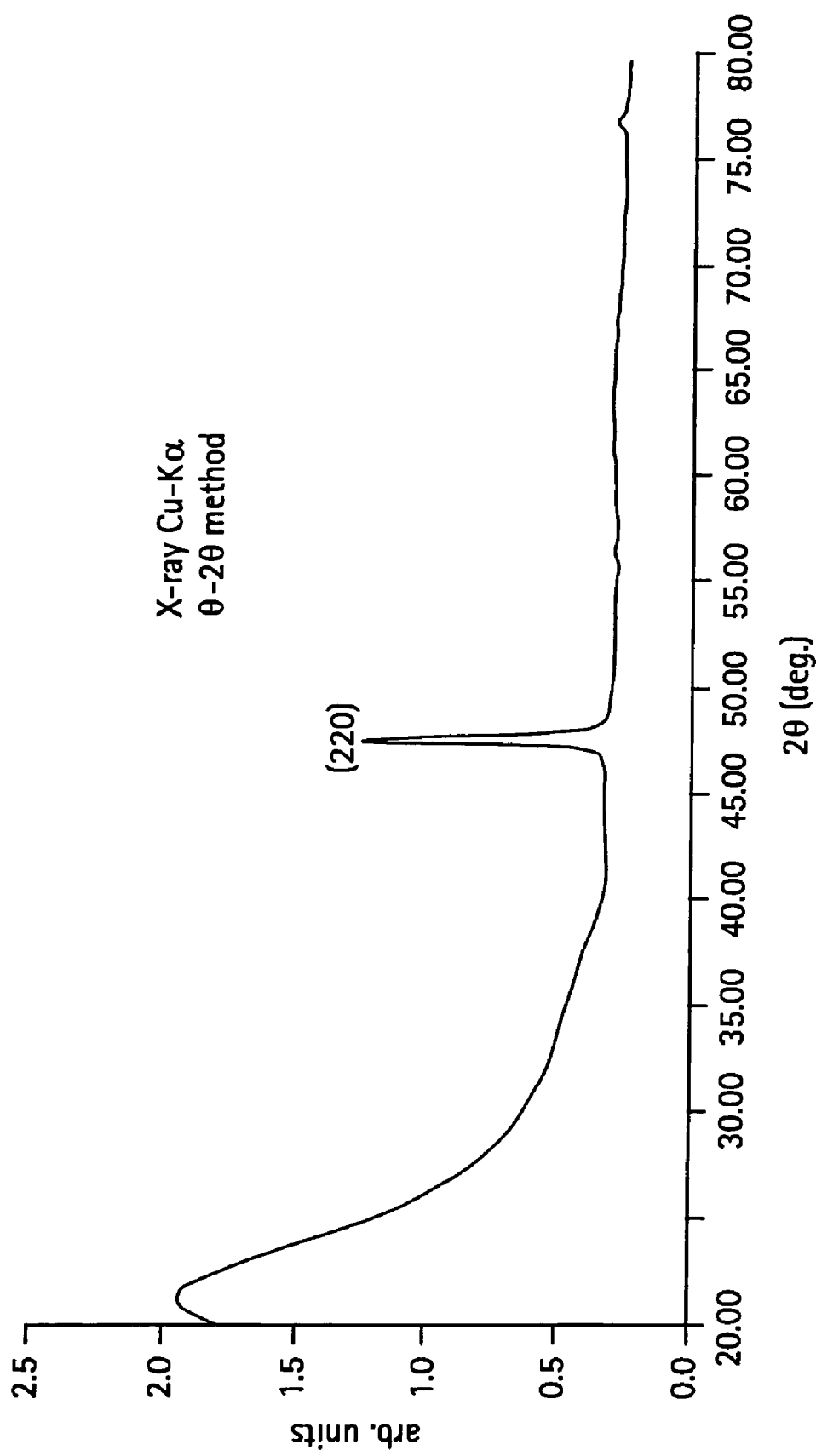
FIG. 17 is a diagram showing a result of X-ray diffraction.

At this stage, FIG. 17 shows an example of a result of measurement by X-ray diffraction in respect of orientation performance of the above-described semiconductor thin film. Further, although a peak in correspondence with (220) plane is shown in the X-ray diffraction pattern, it is naturally equivalent to {110} plane. It has been clarified as a result of the measurement that {110} plane constitutes main orientation and the rate of orientation is 0.7 or higher (typically, 0.9 or higher).

As has been shown above, it is found that the crystalline silicon film according to the fabrication method of the embodiment and the conventional polysilicon film are provided with quite different crystal structures (crystal constitutions). Also in this respect, the crystalline silicon film according to the present invention may be regarded as a quite new semiconductor film.

Further, in forming the semiconductor thin film according to the present invention, the annealing step at temperatures equal to or higher than the crystallization temperature plays an important role in respect of reduction of defects in crystal grains. An explanation will be given thereof.

Figure 14A:
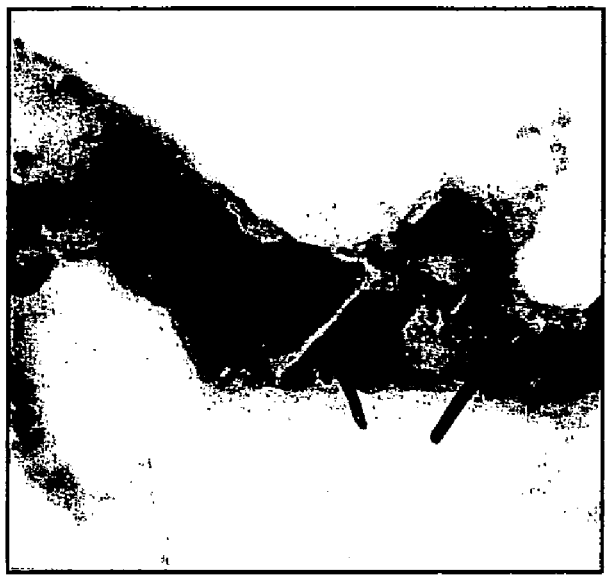
FIGS. 14A and 14B are TEM photograph views indicating crystal grains of a crystalline silicon film.
Figure 14A:

FIG. 14A is a TEM photograph enlarging a crystal silicon film at a time point finished with the above described crystallization steps by a magnification of 250,000, in which a defect seen in a zigzag shape as shown by an arrow mark in crystal grains (black portion and white portion are observed owing to a difference in contrast), is confirmed.

Although such a defect is mainly a stacking fault in which an order of stacking atoms at a silicon crystal lattice face is offset, the defect may be caused by dislocation or the like. FIG. 14A seems to be a stacking fault having a defect face in parallel with {111} plane. This can be predicted from the fact that the defect observed in a zigzag shape is bent to fold by making an angle of about 70°.

Figure 14B:
Figure 14B:

Meanwhile, as shown by FIG. 14B, according to the crystalline silicon film by the fabrication method of the embodiment observed by the same magnification, almost no defect caused by stacking fault or dislocation or the like is observed in the crystal grain and it can be confirmed that the crystalline performance is every excellent. This tendency is applicable to an entire film face and although in the current state, it is difficult to nullify a number of defects, it can be reduced to a degree which can be substantially regarded as null.

That is, according to the crystalline silicon film shown by FIG. 14B, the defect in the crystal grain can be reduced to an almost negligible degree and the grain boundary does not constitute a barrier of movement of carriers owing to the high continuity and accordingly, it can be regarded as a single crystal or a substantially single crystal.

In this way, according to the crystalline silicon films shown by the photographs of FIGS. 14A and 14B, although the grain boundaries are provided with a substantially equivalent continuity, considerable difference is caused in the numbers of defects in the crystal grains. The reason that the crystalline silicon film according to the present invention shows electric characteristics far superior to those in the crystalline silicon film shown by FIG. 14A considerably resides in the difference in the numbers of defects.

The crystalline silicon film by the fabrication method of the embodiment formed in this way (FIG. 14A) is provided with the feature that a number of defects in the crystal grain is significantly smaller than that of the crystalline silicon film (FIG. 14B) in which only the crystallization is simply carried out.

The difference in the number of defects is manifested by a difference in spin density by Electron Spin Resonance (ESR). In the current state, it is found that the spin density of the crystalline silicon film by the fabrication method of the embodiment is at least $5\times10^{17}$ spins/cm$^3$ or lower (preferably, $3\times10^{17}$ spins/cm$^3$ or lower). However, the measured value is near to a detection limit of an existing measurement device and accordingly, it is anticipated that the actual spin density is lower.

The crystalline silicon film according to the present invention having the above-described crystal structure and features, is referred to as Continuous Grain Silicon (CGS).

Although according to the conventional semiconductor thin film, the grain boundary functions as a barrier for hampering movement of carriers, according to the semiconductor thin film by the fabrication method of the embodiment, such a grain boundary does not substantially exist and accordingly, high carrier mobility is realized. Therefore, the electric characteristics of TFT fabricated by using the semiconductor thin film by the fabrication method of the embodiment show very excellent values. A description will be given thereof as follows.

(Knowledge in Respect of Electric Characteristics of TFT)

The semiconductor thin film by the fabrication method of the embodiment can substantially be regarded as a single crystal (substantially, grain boundary is not present) and accordingly, TFT having the semiconductor film as an activation layer shows electric characteristics comparable to MOSFET using single crystal silicon. The following data is provided from TFT which the applicant has trially fabricated.

(1) The sub threshold coefficient constituting an index of switching function (swiftness in switching ON/OFF operation) of TFT is as small as 60 through 100 mV/decade (representatively, 60 through 85 mV/decade) both in N-channel type TFT and P-channel type TFT.

(2) The field effect mobility ($\mu_{FE}$) constituting an index of operation speed of TFT is as large as 200 through 650 cm$^2$/Vs (representatively, 250 through 300 cm$^2$/Vs) in N-channel type TFT and 100 through 300 cm$^2$/Vs (representatively, 150 through 200 cm$^2$/Vs) in P-channel type TFT.

(3) The threshold value voltage ($V_{th}$) constituting an index of drive voltage of TFT is as small as −0.5 through 1.5 V in N-channel type TFT and −1.5 through 0.5 V in P-channel type TFT.

As described above, it has been confirmed that extremely excellent switching characteristic and high speed operation characteristic can be realized.

Further, in forming CGS, the annealing step at temperatures equal to or higher than the crystallizing temperature (700 through 1100° C.) mentioned above, plays an important role with regard to reduction in defects in crystal grains. An explanation thereof will be given as follows.

It is found from the above-described facts that in fabricating CGS, the gettering process of the catalyst element is an indispensable step. The inventors consider the following model with regard to a phenomenon caused by the step.

First, in the state shown by FIG. 14A, at a defect in the crystal grain (mainly stacking fault), a catalyst element (representatively, nickel) is segregated. That is, a number of bonds in a form of Si—Ni—Si seem to be present.

However, when Ni present at the defect is removed by carrying out the gettering process of the catalyst element, Si—Ni bond is cut. Therefore, extra bond element of silicon immediately forms Si—Si bond and is stabilized. Thereby, the defect is extinguished.

Naturally, it is known that the defect in the crystal silicon film is extinguished by thermal annealing at high temperatures, however, it can be predicted that rebonding of silicon is smoothly carried out since a number of unbonded elements are caused by cutting bonding with nickel.

Further, the inventors consider also a model in which by carrying out the heating treatment at temperatures (700 through 1100° C.) equal to or higher than the crystallizing temperature, the crystal silicon film and its matrix are fixed together and the adherence is promoted by which the defect is extinguished.

(Knowledge in Respect of Relation Between TFT Characteristics and CGS)

The excellent TFT characteristics mentioned above considerably reside in that the semiconductor thin film having the continuity is utilized in crystal lattices at a grain boundary. The reason will be studied as follows.

The continuity of crystal lattices at a grain boundary is caused by the fact that the grain boundary is a grain boundary referred to as "planar boundary". The definition of a planar boundary according to the specification is "planar boundary" described in "Characterization of High-Efficiency Cast-Si Solar Cell Wafers by MBIC measurement; Ryuichi Shimokawa and Yutaka Hayashi, Japanese Journal of Applied Physics Vol. 27, No. 5, pp. 751-758, 1988".

According to the paper, the planar boundary includes {111} twin grain boundary, {111} stacking fault, {221} twin grain boundary, {221} twist grain boundary and so on. The planar boundary is provided with a feature that it is electrically inactive. That is, although the planar boundary is a grain boundary, it does not function as a trap for hampering movement of carriers and accordingly, it can be regarded as that it is not substantially present.

Particularly, {111} twin grain boundary is also referred to as a corresponding grain boundary of Σ3 and {221} twin grain boundary is also referred to as a corresponding grain boundary of Σ9. A Σ value is a parameter constituting an index showing a degree of commensurating performance of a corresponding grain boundary and it is known that the smaller the Σ value, the more excellent commensurating performance is given to a grain boundary.

As a result of the applicant's detailed observation by TEM on the semiconductor thin film by the fabrication method of the embodiment, it has been found that almost all (90% or more, typically, 95% or more) of grain boundaries are corresponding grain boundaries of Σ3, that is {111} twin grain boundaries.

In a grain boundary formed between two crystal grains, in the case where the face orientation of both of the crystals is {110}, when an angle made by {111} face and a corresponding lattice stripe is designated by notation θ, the grain boundary becomes a corresponding grain boundary of Σ3 if θ=70.5°.

Therefore, according to the grain boundary shown by the TEM photograph of FIG. 12A, respective lattice stripes of contiguous crystal grains are made continuous by an angle of about 70° and it can easily be predicted that the grain boundary is {111} twin grain boundary.

Further, the grain boundary becomes a corresponding grain boundary of Σ9 when θ=38.9° and such other grain boundary is also present.

Such a corresponding grain boundary is formed only between crystal grains in the same face orientation. That is, according to the semiconductor thin film of the present invention, the face orientation is aligned substantially in {110} and therefore, such a corresponding grain boundary can be formed over a wide range. The feature cannot be achieved by other polysilicon film having irregular plane orientation.

Figure 15A:
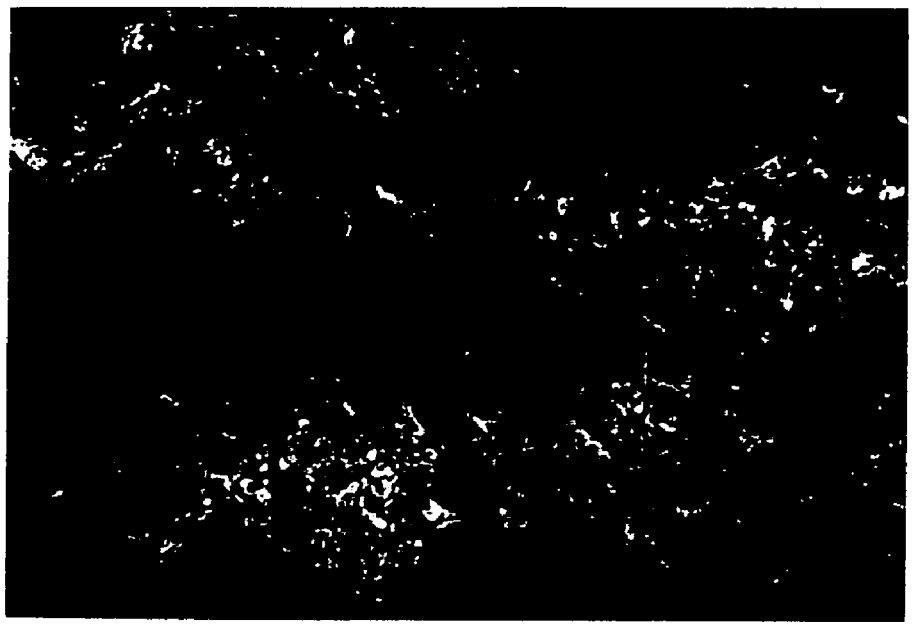
FIGS. 15A and 15B are photograph views of dark field images of semiconductor thin films.

Here, FIG. 15A shows a TEM photograph (dark field image) enlarging the semiconductor thin film by the fabrication method of the embodiment by a resolution of 15,000. Although there are regions in white and regions in black, it indicates that portions in the same color are provided with the same orientation performance.

What is to be noted in FIG. 15A is that regions in white are continuously distributed with a considerable rate in such a wide range of the dark field image. This signifies that crystal grains having the same orientation performance are present with some degree of directionality and almost the same orientation performance is provided to contiguous crystal grains.

Figure 15B:

Meanwhile, FIG. 15B shows a TEM photograph (dark field image) enlarging a conventional high temperature polysilicon film by a resolution of 15,000. According to the conventional high temperature polysilicon film, portions having the same face orientation are scattered at random and the distribution having the directionality as shown by FIG. 15A cannot be confirmed. It seems that the orientation of contiguous crystal grains is quite irregular.

Further, the applicant has repeated observation and measurement over a number of regions other than measurement points shown by FIGS. 12A and 12B and confirmed that the continuity of the crystal lattices at grain boundaries is maintained over a wide region sufficient for fabricating TFT.

The embodiment of the present invention explained above is an example of a display device integrally formed with the signal dividing circuit on the same substrate for the circuit of the pixel matrix unit and the drive circuit. However, the same is applicable to forming only the signal dividing circuit on the substrate.

Further, a number of the input digital signal lines may not be one but may be plural and the signal division number m may not be 4 but may be a natural number of 2 or more. Also the modified digital signal may not be constituted by extending over time the pulse length of the input digital signal by any magnification and the magnification is not limited to the magnification of m. The frequency of the input digital signal is not naturally limited to 80 MHz. When the frequency of the input digital signal is equal to or lower than 80 MHz, naturally, no problem is posed and the frequency may be one hundred and several tens MHz.

Embodiment 2

In this embodiment, an explanation will be given of a case in which the input digital signal number n is set to 1 and the signal division number m is set to 8 in the signal dividing circuit according to the present invention shown by FIGS. 3A and 3B. Further, the frequency of the input digital signal is set to 80 MHz. Further, fabrication method follows the method of Embodiment 1.

Figure 16:
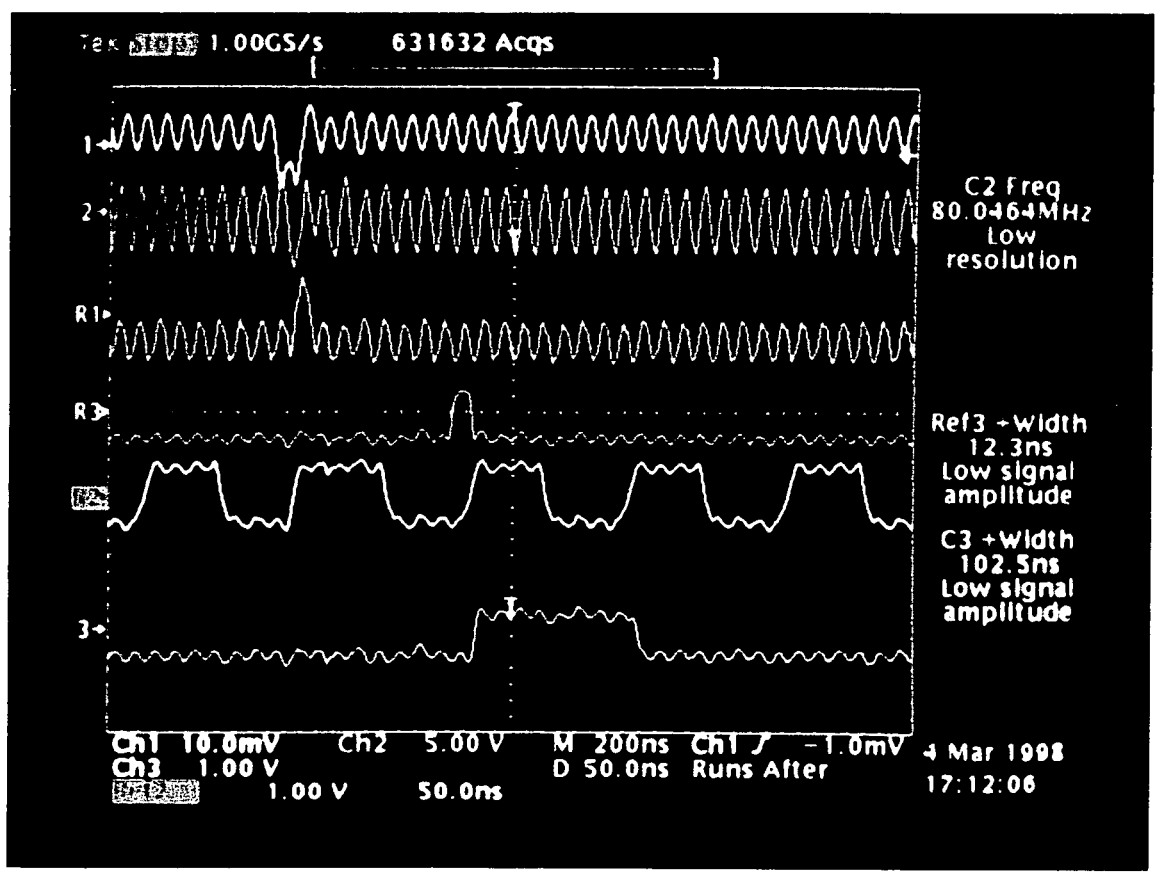
FIG. 16 is an oscilloscope diagram of operating waveforms of a signal dividing circuit according to an embodiment of the present invention.

FIG. 16 shows a result of measuring operation of the signal dividing circuit of the embodiment by an oscilloscope. An explanation will be given of respective signal waveforms. In this case, an explanation will be given of respective signal waveforms by using notations (1, 2, 3, R1, R2, R3) on the left of the respective signal waveforms.

The signal waveform 1 monitors a reset signal. The signal waveform 2 monitors a clock signal. The signal waveform R1 monitors the input digital signal. In this embodiment, as mentioned above, the frequency of the input digital signal is set to 80 MHz. The signal waveform R2 monitors an output signal from a synchronous counter (counter). The signal waveform 3 shows an output digital signal (10 MHz) from the signal dividing circuit.

As is apparent from the signal waveforms of the oscilloscope in FIG. 16, the input digital signal inputted at 80 MHz is outputted as the output digital signal at 10 MHz.

By using the present invention disclosed in the specification, production cost of a semiconductor display device with a digital signal as an input signal can be reduced. That is, a signal dividing circuit is constituted by using TFTs and is formed simultaneously on a substrate the same as that of a circuit of a pixel matrix unit and a drive circuit and accordingly, steps or expense required in externally mounting ICs of the signal dividing circuit is dispensed with.

Further, as a secondary effect, compared with a case of externally mounting ICs, while maintaining power consumption for operation at a same degree, a considerable increase in a number of connection lines to outside of a substrate in the case of a large signal division number m is avoided and danger of occurrence of connection failure or the like can also be restrained.

What is claimed is:

1. A semiconductor device comprising:
    an active matrix circuit on an insulating surface;
    a signal line driver circuit and a scanning line driver circuit on the insulating surface; and
    a circuit for extending a length of a pulse of input digital signals,
    wherein each of the active matrix circuit, the signal line driver circuit, the scanning line driver circuit, and the circuit comprises a plurality of thin film transistors formed on the insulating surface, and
    wherein each of the plurality of thin film transistors comprises a crystalline semiconductor layer, and crystal grains in the crystalline semiconductor layer extend substantially in parallel to the insulating surface and are oriented substantially in {110} plane at least partly.

2. The semiconductor device according to claim 1 wherein the plurality of thin film transistors comprise at least one p-channel type thin film transistor and at least one n-channel type thin film transistor.

3. The semiconductor device according to claim 2 wherein a field effect mobility of holes of the p-channel type thin film transistor is equal to or more than 150 cm$^2$/Vs and a field effect mobility of electrons of the n-channel type thin film transistor is equal to or more than 150 cm$^2$/Vs.

4. The semiconductor device according to claim 2 wherein an S value of the p-channel type thin film transistor is equal to or smaller than 0.15 V/dec and an S value of the n-channel type thin film transistor is equal to or smaller than 0.15 V/dec.

5. The semiconductor device circuit according to claim 2 wherein a threshold voltage of the p-channel type thin film transistor is between −0.1 V and 0.0 V and a threshold voltage of the n-channel type thin film transistor is between 0.0 V and 1.0 V.

6. The semiconductor device according to claim 1 wherein the semiconductor device is an active matrix type liquid crystal display device or an electroluminescence display device.

7. A semiconductor device comprising:
    an active matrix circuit on an insulating surface;
    a signal line driver circuit and a scanning line driver circuit on the insulating surface; and
    a circuit for reducing a frequency of input digital signals,
    wherein each of the active matrix circuit, the signal line driver circuit, the scanning line driver circuit, and the circuit comprises a plurality of thin film transistors formed on the insulating surface, and
    wherein each of the plurality of thin film transistors comprises a crystalline semiconductor layer, and crystal grains in the crystalline semiconductor layer extend substantially in parallel to the insulating surface and are oriented substantially in {110} plane at least partly.

8. The semiconductor device according to claim 7 wherein the plurality of thin film transistors comprise at least one p-channel type thin film transistor and at least one n-channel type thin film transistor.

9. The semiconductor device according to claim 8 wherein a field effect mobility of holes of the p-channel type thin film transistor is equal to or more than 150 cm$^2$/Vs and a field effect mobility of electrons of the n-channel type thin film transistor is equal to or more than 150 cm$^2$/Vs.

10. The semiconductor device according to claim 8 wherein an S value of the p-channel type thin film transistor is equal to or smaller than 0.15 V/dec and an S value of the n-channel type thin film transistor is equal to or smaller than 0.15 V/dec.

11. The semiconductor device circuit according to claim 8 wherein a threshold voltage of the p-channel type thin film transistor is between −0.1 V and 0.0 V and a threshold voltage of the n-channel type thin film transistor is between 0.0 V and 1.0 V.

12. The semiconductor device according to claim 8 wherein the semiconductor device is an active matrix type liquid crystal display device or an electroluminescence display device.

* * * * *